US012046631B2

(12) United States Patent
Park et al.

(10) Patent No.: US 12,046,631 B2
(45) **Date of Patent: *Jul. 23, 2024**

(54) SEMICONDUCTOR DEVICE INCLUDING AN ELEMENT SEPARATION STRUCTURE

(71) Applicant: SAMSUNG ELECTRONICS CO., LTD., Suwon-si (KR)

(72) Inventors: Sung Sik Park, Hwaseong-si (KR); Sang Jin Kim, Suwon-si (KR); Tae Hwan Oh, Seoul (KR); Hyun Jeong Lee, Hwaseong-si (KR); Sung Jin Jang, Suwon-si (KR); Gyu Min Jeong, Ulsan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/065,986

(22) Filed: Dec. 14, 2022

(65) Prior Publication Data

US 2023/0116475 A1 Apr. 13, 2023

Related U.S. Application Data

(63) Continuation of application No. 17/363,861, filed on Jun. 30, 2021, now Pat. No. 11,552,167.

(30) Foreign Application Priority Data

Jul. 13, 2020 (KR) ........................ 10-2020-0085972

(51) Int. Cl.
*H01L 27/01* (2006.01)
*H01L 21/762* (2006.01)
(Continued)

(52) U.S. Cl.
CPC .... *H01L 29/0649* (2013.01); *H01L 21/76224* (2013.01); *H01L 29/6656* (2013.01); *H01L 29/66795* (2013.01); *H01L 21/823431* (2013.01)

(58) Field of Classification Search
CPC ........... H01L 29/0649; H01L 21/76224; H01L 29/6656; H01L 29/66795;
(Continued)

(56) References Cited

U.S. PATENT DOCUMENTS 8,242,022 B2 8/2012 Kim
8,835,321 B2 9/2014 Ha
(Continued)

OTHER PUBLICATIONS

Notice of Allowance dated Sep. 14, 2022 in corresponding U.S. Appl. No. 17/363,861.

*Primary Examiner* — Theresa T Doan
(74) *Attorney, Agent, or Firm* — F. Chau & Associates, LLC

(57) ABSTRACT

A semiconductor device includes first and second active patterns extending in a first direction, a first epitaxial pattern on the first active pattern and adjacent to the second active pattern, a second epitaxial pattern on the second active pattern and adjacent to the first active pattern, an element separation structure separating the first and second active patterns between the first and second epitaxial patterns, and including a core separation pattern, and a separation side wall pattern on a side wall of the core separation pattern, and a gate structure extending in a second direction intersecting the first direction, on the first active pattern. An upper surface of the gate structure is on the same plane as an upper surface of the core separation pattern. The separation side wall pattern includes a high dielectric constant liner, which includes a high dielectric constant dielectric film including a metal.

20 Claims, 36 Drawing Sheets

(51) Int. Cl.

| | |
|---|---|
| ***H01L 27/12*** | (2006.01) |
| ***H01L 29/06*** | (2006.01) |
| ***H01L 29/66*** | (2006.01) |
| ***H01L 31/0392*** | (2006.01) |
| *H01L 21/8234* | (2006.01) |

(58) Field of Classification Search

CPC ......... H01L 21/823431; H01L 27/0886; H01L 29/4966; H01L 27/088; H01L 21/823481; H01L 21/823412; H01L 21/823418; H01L 21/823475; H01L 29/785; H01L 29/78696

USPC .......................................................... 257/351

See application file for complete search history.

(56) References Cited

U.S. PATENT DOCUMENTS

| | | | | |
|---|---|---|---|---|
| 9,093,378 | B2 | 7/2015 | Kim et al. | |
| 9,412,616 | B1 | 8/2016 | Xie et al. | |
| 9,793,273 | B2 | 10/2017 | Liaw | |
| 9,972,702 | B2 | 5/2018 | Chen et al. | |
| 10,090,382 | B1 | 10/2018 | Yu et al. | |
| 10,403,548 | B2 | 9/2019 | Zang et al. | |
| 11,552,167 | B2 * | 1/2023 | Park .................... | H01L 29/0649 |
| 2017/0287933 | A1 | 10/2017 | Chen et al. | |
| 2022/0013630 | A1 | 1/2022 | Park et al. | |

* cited by examiner

SEMICONDUCTOR DEVICE INCLUDING AN ELEMENT SEPARATION STRUCTURE

CROSS-REFERENCE TO RELATED APPLICATION

This application is a continuation application of U.S. patent application Ser. No. 17/363,861 filed Jun. 30, 2021, which claims priority under 35 U.S.C. § 119 to Korean Patent Application No. 10-2020-0085972, filed on Jul. 13, 2020 in the Korean Intellectual Property Office, the disclosure of which are incorporated by reference herein in their entirety.

TECHNICAL FIELD

Exemplary embodiments of the inventive concept relate to a semiconductor device including an element separation structure.

DISCUSSION OF RELATED ART

One of the scaling techniques for increasing density of a semiconductor device is using a multi gate transistor, in which a multi-channel active pattern (or a silicon body) having a fin or nanowire shape is formed on a substrate and a gate is formed on a surface of the multi-channel active pattern.

Since the multi gate transistor utilizes a three-dimensional channel, scaling is easily performed. Moreover, even when a gate length of the multi gate transistor is not increased, a current control capability can be improved. Furthermore, it is possible to effectively suppress a SCE (short channel effect) in which the potential of a channel region is influenced by a drain voltage.

SUMMARY

According to an exemplary embodiment of the inventive concept, a semiconductor device includes a first active pattern and a second active pattern each extending in a first direction, a first epitaxial pattern which is placed on the first active pattern and disposed adjacent to the second active pattern, a second epitaxial pattern which is placed on the second active pattern and disposed adjacent to the first active pattern, an element separation structure which separates the first active pattern and the second active pattern between the first epitaxial pattern and the second epitaxial pattern, where the element separation structure includes a core separation pattern, and a separation side wall pattern on a side wall of the core separation pattern, and a gate structure extending in a second direction intersecting the first direction, on the first active pattern. An upper surface of the gate structure is placed on the same plane as an upper surface of the core separation pattern, the separation side wall pattern includes a high dielectric constant liner, and the high dielectric constant liner includes a high dielectric constant dielectric film including a metal.

According to an exemplary embodiment of the inventive concept, a semiconductor device includes an element separation structure which includes a first extended separation structure and a second extended separation structure extending in a first direction, and a third extended separation structure and a fourth extended separation structure extending in a second direction different from the first direction, where the element separation structure has a closed-loop shape, a first active pattern and a second active pattern which are separated by the first extended separation structure and each extend in the second direction, a first gate structure extending in the first direction, including a gate electrode, and disposed on the first active pattern, and a gate separation structure which is formed along the second direction and faces a first side of the gate electrode. The third extended separation structure is placed on a part of the gate separation structure.

According to an exemplary embodiment of the inventive concept, a semiconductor device includes a first active pattern and a second active pattern each extending in a first direction, a first epitaxial pattern on the first active pattern, a second epitaxial pattern on the second active pattern, a first element separation structure which separates the first active pattern and the second active pattern, between the first epitaxial pattern and the second epitaxial pattern, a gate structure extending in a second direction intersecting the first direction, on the first active pattern, a gate separation structure which is in contact with the first element separation structure, and a second element separation structure which is placed on the gate separation structure and directly connected to the first element separation structure. An upper surface of the second element separation structure is placed on the same plane as an upper surface of the gate structure and an upper surface of the first element separation structure.

According to an exemplary embodiment of the inventive concept, a method of fabricating a semiconductor device includes forming a plurality of pre gate structures separated by an interlayer insulating film, where the plurality of pre gate structures are spaced apart in a first direction and extend in a second direction intersecting the first direction, forming a mask pattern on a portion of the plurality of pre gate structures, forming a replacement pattern along side walls of the mask pattern, where the replacement pattern has a closed-loop shape extending in the first direction and the second direction, forming a filling mask pattern surrounding the replacement pattern, removing the replacement pattern to form an element separation trench, and forming a core separation pattern that fills the element separation trench.

BRIEF DESCRIPTION OF THE DRAWINGS

The above and other aspects and features of the inventive concept will become more apparent by describing in detail exemplary embodiments thereof with reference to the attached drawings.

DETAILED DESCRIPTION OF THE EMBODIMENTS

Figure 1:
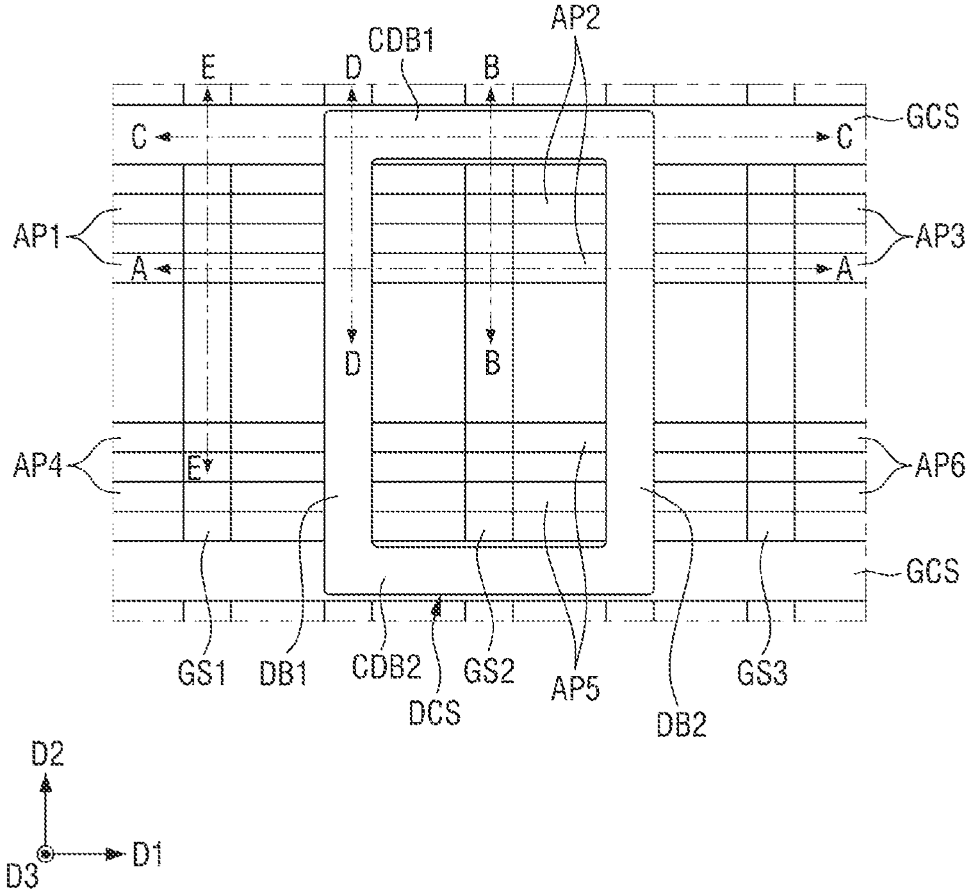
FIG. 1 is an exemplary layout view for explaining a semiconductor device according to an exemplary embodiment of the inventive concept.

Exemplary embodiments of the inventive concept provide a semiconductor device in which a degree of integration of elements is enhanced, and reliability and performance are improved.

Exemplary embodiments of the inventive concept also provide a method for fabricating a semiconductor device in which the degree of integration of elements is enhanced, and reliability and performance are improved.

Exemplary embodiments of the inventive concept will be described more fully hereinafter with reference to the accompanying drawings. Like reference numerals may refer to like elements throughout this application.

Although drawings of a semiconductor device according to exemplary embodiments of the inventive concept show a fin type transistor (FinFET) including a fin-type patterned channel region, and a transistor including a nanowire or a nanosheet, the inventive concept is not limited thereto. The inventive concept may be applied to a two-dimensional material-based transistor (2D material-based FETs) and a heterostructure thereof.

Additionally, the semiconductor device according to exemplary embodiments of the inventive concept may include a tunneling FET or a three-dimensional (3D) transistor. The semiconductor device according to exemplary embodiments of the inventive concept may also include a bipolar junction transistor, a laterally-diffused metal-oxide semiconductor (LDMOS), or the like.

FIGS. 1 to 9 are diagrams for explaining a semiconductor device according to exemplary embodiments of the inventive concept.

Figure 2:
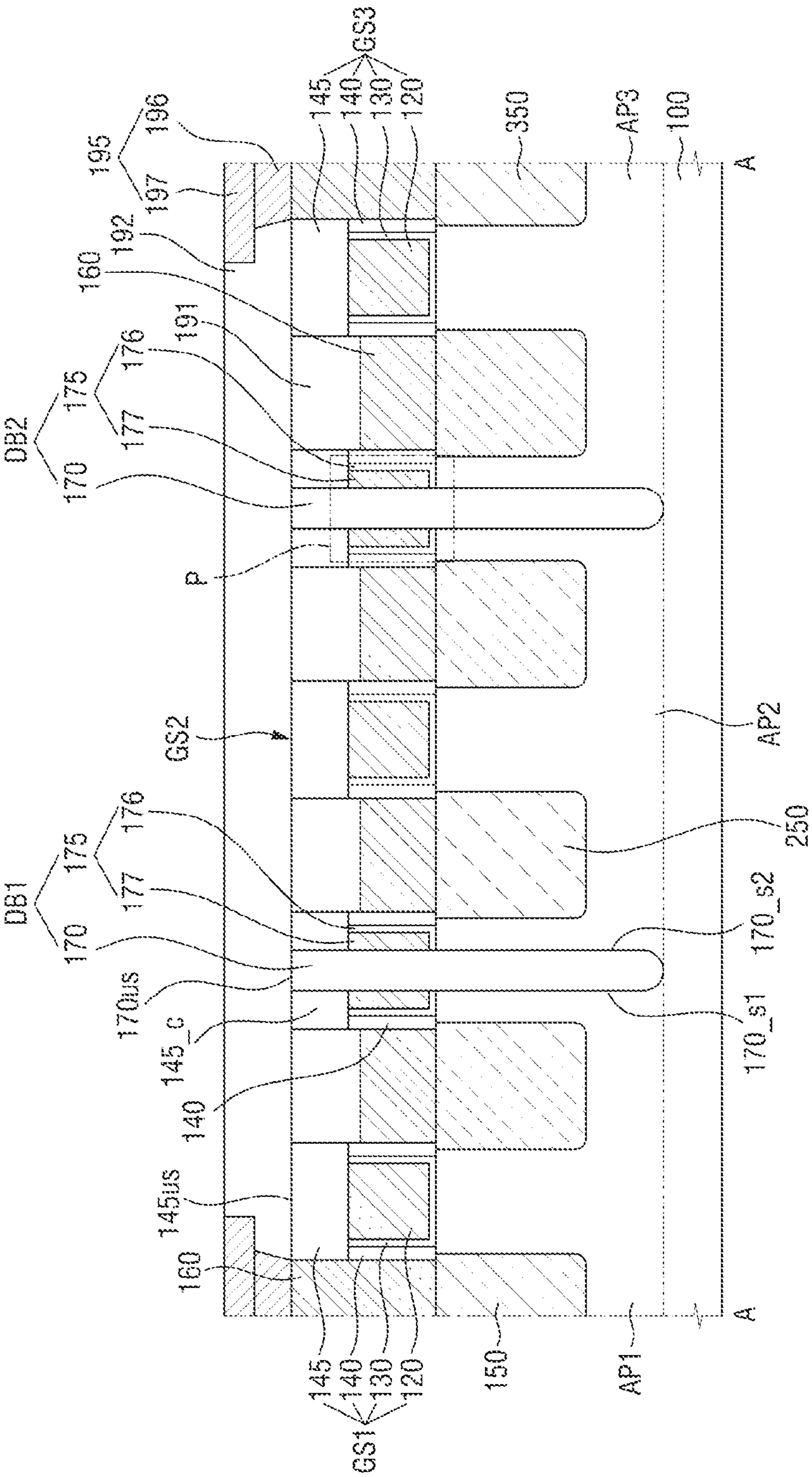
FIGS. 2 to 6 are cross-sectional views taken along lines A-A, B-B, C-C, D-D and E-E of FIG. 1 according to an exemplary embodiment of the inventive concept.
Figure 3:
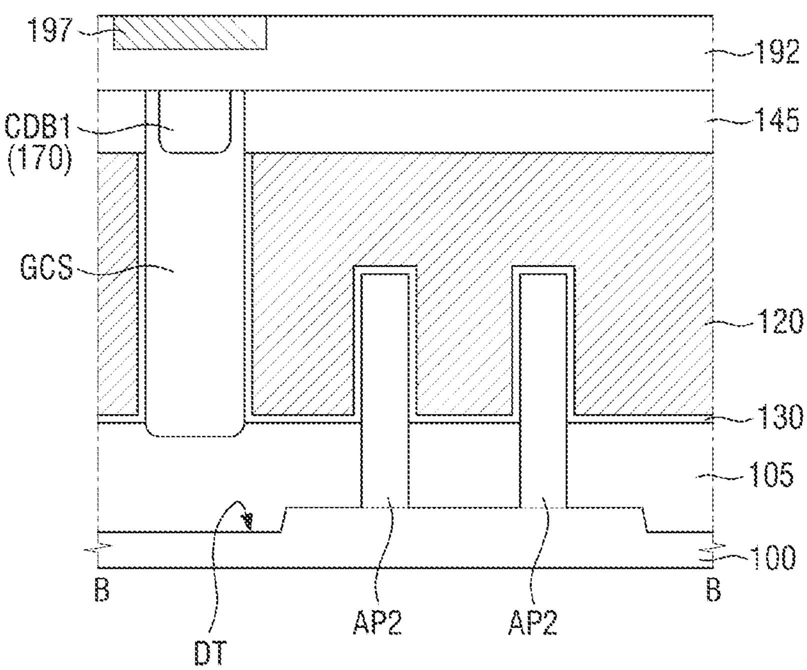
Figure 7:
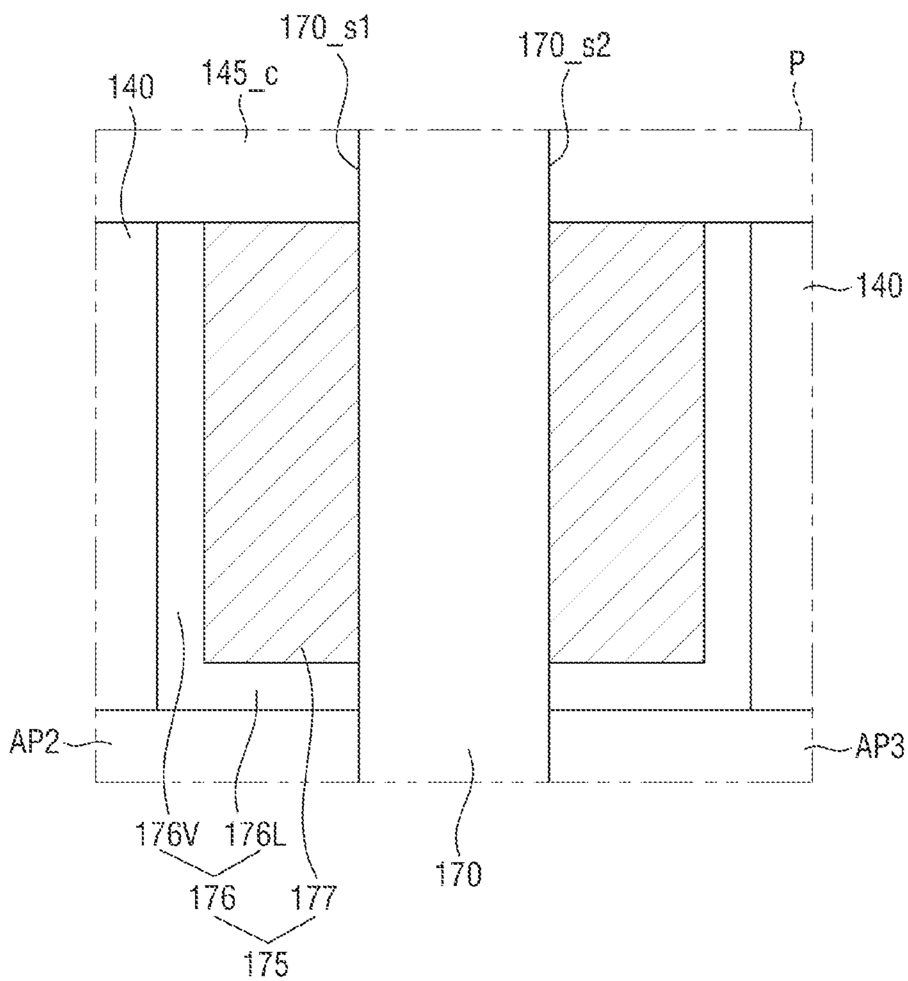
FIGS. 7 to 9 are exemplary views in which a region P of FIG. 2 is enlarged according to exemplary embodiments of the inventive concept.
Figure 8:
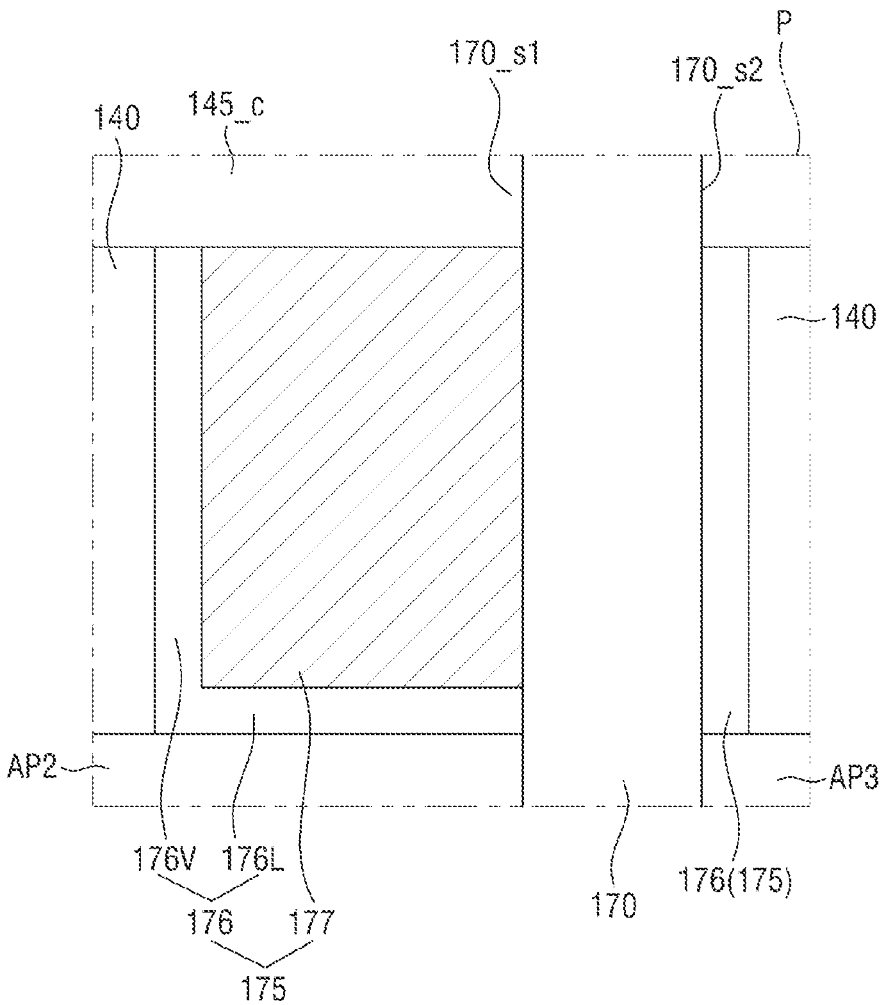
Figure 9:
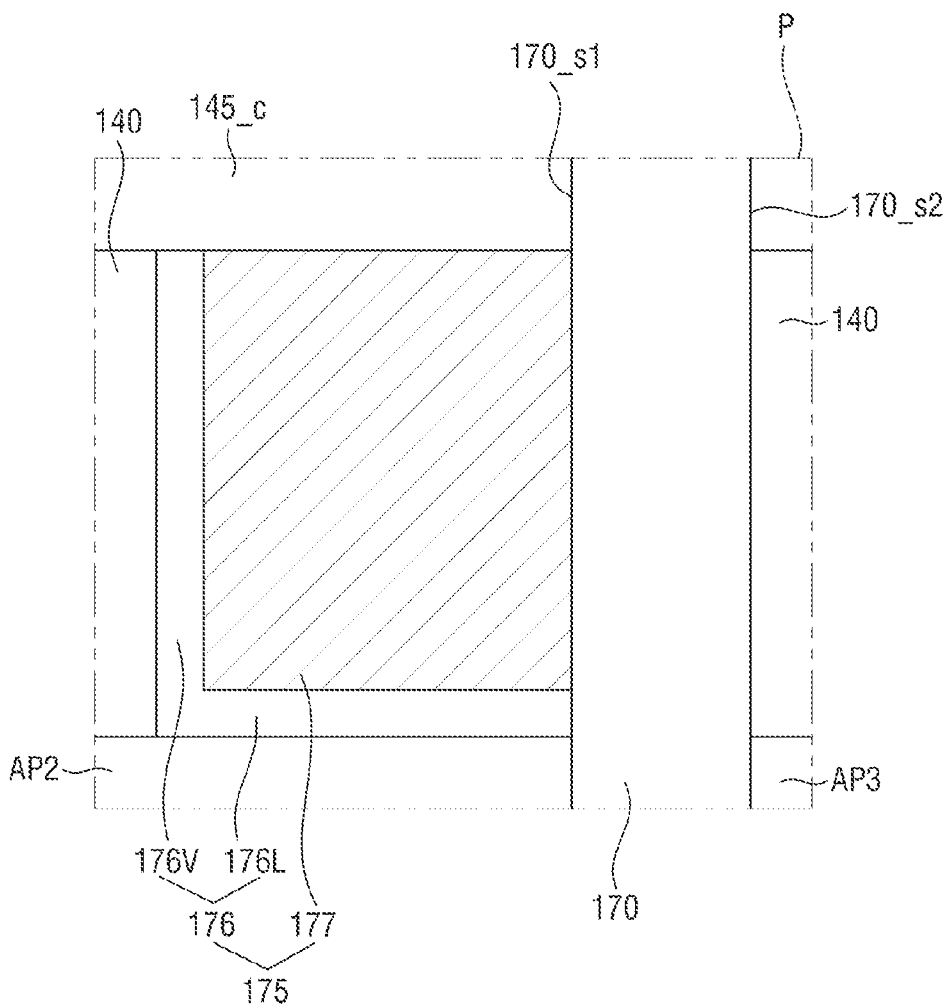

FIG. 1 is an exemplary layout view for explaining a semiconductor device according to an exemplary embodiment of the inventive concept. FIGS. 2 to 6 are cross-sectional views taken along lines A-A, B-B, C-C, D-D, and E-E of FIG. 1 according to an exemplary embodiment of the inventive concept. FIGS. 7 to 9 are exemplary views in which a region P of FIG. 2 is enlarged according to exemplary embodiments of the inventive concept.

For convenience of explanation, interlayer insulating films 191 and 192, a source/drain contact 160, and a wiring structure 195 are not shown in FIG. 1.

Referring to FIGS. 1 to 9, the semiconductor device according to exemplary embodiments of the inventive concept may include first to sixth active patterns AP1 to AP6, first to third gate structures GS1 to GS3, a gate separation structure GCS, and an element separation structure DCS.

The substrate 100 may be bulk silicon or SOI (silicon-on-insulator). Alternatively, the substrate 100 may be a silicon substrate, or may include, but is not limited to, other materials such as silicon germanium, SGOI (silicon germanium on insulator), indium antimonide, lead tellurium compounds, indium arsenide, phosphide indium, gallium arsenide, or gallium antimonide.

The first to sixth active patterns AP1 to AP6 may each protrude from a substrate 100. Each of the first to sixth active patterns AP1 to AP6 may extend along a first direction D1 on the substrate 100. For example, each of the first to sixth active patterns AP1 to AP6 may include a long side extending in the first direction D1, and a short side extending in a second direction D2. Here, the first direction D1 may intersect the second direction D2 and a third direction D3. Additionally, the second direction D2 may intersect the third direction D3.

The first to third active patterns AP1 to AP3 may be placed in a line along the first direction D1. The second active pattern AP2 may be spaced apart from the first active pattern AP1 and the third active pattern AP3 in the first direction D1.

The first active pattern AP1 and the second active pattern AP2 may be separated by the element separation structure DCS to be described below, and the second active pattern AP2 and the third active pattern AP3 may be separated by the element separation structure DCS.

The fourth to sixth active patterns AP4 to AP6 may be placed in a line along the first direction D1. The fifth active pattern AP5 may be spaced apart from the fourth active pattern AP4 and the sixth active pattern AP6 in the first direction D1.

The fourth active pattern AP4 and the fifth active pattern AP5 may be separated by the element separation structure DCS to be described below, and the fifth active pattern AP5 and the sixth active pattern AP6 may be separated by the element separation structure DCS.

The fourth active pattern AP4 may be spaced apart from the first active pattern AP1 in the second direction D2. The fifth active pattern AP5 may be spaced apart from the second active pattern AP2 in the second direction D2. The sixth active pattern AP6 may be spaced apart from the third active pattern AP3 in the second direction D2.

The first to third active patterns AP1 to AP3 may be placed in an active region defined by a deep trench DT. The fourth to sixth active patterns AP4 to AP6 may be placed in the active region defined by the deep trench DT. The deep trench DT may be formed between the first to third active patterns AP1 to AP3 and the fourth to sixth active patterns AP4 to AP6. In the semiconductor device according to exemplary embodiments of the inventive concept, the deep trench DT may distinguish an active region in which the first to third active patterns AP1 to AP3 are placed from an active region in which the fourth to sixth active patterns AP4 to AP6 are placed.

The first to sixth active patterns AP1 to AP6 may be placed between the gate separation structures GCS to be described below.

The first to sixth active patterns AP1 to AP6 may be multi-channel active patterns. In the semiconductor device according to exemplary embodiments of the inventive concept, each of the first to sixth active patterns AP1 to AP6 may be, for example, a fin type pattern. Each of the first to sixth active patterns AP1 to AP6 may be used as channel patterns of a transistor. Although two of each of the first to sixth active patterns AP1 to AP6 are shown, this is only for convenience of explanation, and the number thereof is not limited thereto. Each of the first to sixth active patterns AP1 to AP6 may be one or more.

Each of the first to sixth active patterns AP1 to AP6 may be a part of the substrate 100, and may include an epitaxial layer that is grown from the substrate 100. Each of the first to sixth active patterns AP1 to AP6 may include, for example, silicon or germanium, which is an elemental semiconductor material. Additionally, each of the first to sixth active patterns AP1 to AP6 may include a compound semiconductor, and may include, for example, a group IV-IV compound semiconductor or a group III-V compound semiconductor.

The group IV-IV compound semiconductor may be, for example, a binary compound or a ternary compound including at least two of carbon (C), silicon (Si), germanium (Ge), and tin (Sn), or a compound obtained by doping these elements with a group IV element.

The group III-V compound semiconductor may be, for example, one of a binary compound, a ternary compound, or a quaternary compound obtained by combining at least one of aluminum (Al), gallium (Ga), and indium (In) as a group III element with one of phosphorus (P), arsenic (As), and antimony (Sb) as a group V element.

As an example, the first to sixth active patterns AP1 to AP6 may include the same material. As another example, the first to third active patterns AP1 to AP3 may include a material different from the fourth to sixth active patterns AP4 to AP6.

A field insulating film 105 may be formed on the substrate 100. The field insulating film 105 may fill the deep trench DT.

The field insulating film 105 may be formed on a part of the side walls of the first to sixth active patterns AP1 to AP6. Each of the first to sixth active patterns AP1 to AP6 may protrude upward from an upper surface of the field insulating film 105. The field insulating film 105 may include, for example, an oxide film, a nitride film, an oxynitride film, or a combination thereof.

Each of the first to third gate structures GS1 to GS3 may be placed on the field insulating film 105. Each of the first to third gate structures GS1 to GS3 may extend in the second direction D2. The second gate structure GS2 may be spaced apart from the first gate structure GS1 and the third gate structure GS3 in the first direction D1.

The first gate structure GS1 may be placed on the first active pattern AP1 and the fourth active pattern AP4. The first gate structure GS1 may intersect the first active pattern AP1 and the fourth active pattern AP4. The second gate structure GS2 may be placed on the second active pattern AP2 and the fifth active pattern AP5. The second gate structure GS2 may intersect the second active pattern AP2 and the fifth active pattern AP5. The third gate structure GS3 may be placed on the third active pattern AP3 and the sixth active pattern AP6. The third gate structure GS3 may intersect the third active pattern AP3 and the sixth active pattern AP6.

Each of the first to third gate structures GS1 to GS3 may include a gate electrode 120, a gate insulating film 130, a gate spacer 140, and a gate capping pattern 145.

The gate electrode 120 may be formed on the first to sixth active patterns AP1 to AP6. The gate electrode 120 may intersect the first to sixth active patterns AP1 to AP6. The gate electrode 120 may surround the first to sixth active patterns AP1 to AP6 protruding beyond the upper surface of the field insulating film 105. The gate electrode 120 may include a long side extending in the second direction D2, and a short side extending in the first direction D1.

The gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate spacer 140 may be placed on the side walls of the gate electrode 120. The gate spacer 140 may extend in the second direction D2. The gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or combinations thereof.

The gate insulating film 130 may extend along the side walls and the bottom surface of the gate electrode 120. The gate insulating film 130 may be placed between the gate electrode 120 and the first to sixth active patterns AP1 to AP6, and between the gate electrode 120 and the field insulating film 105. The gate insulating film 130 may be placed between the gate electrode 120 and the gate spacer 140.

The gate insulating film 130 may include silicon oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The gate capping pattern 145 may be placed on an upper surface of the gate electrode 120 and an upper surface of the gate spacer 140. The gate capping pattern 145 may include, for example, at least one of silicon nitride (SiN), silicon oxynitride (SiON), silicon oxide ($SiO_2$), silicon carbonitride (SiCN), silicon oxycarbonitride (SiOCN), or combinations thereof.

Unlike the shown case, the gate capping pattern 145 may be placed between the gate spacers 140. In such a case, the upper surface of the gate capping pattern 145 may be placed on the same plane as the upper surface of the gate spacer 140.

A first epitaxial pattern 150 may be placed on the first active pattern AP1. A second epitaxial pattern 250 may be placed on the second active pattern AP2. A third epitaxial pattern 350 may be placed on the third active pattern AP3.

The first epitaxial pattern 150 may be included in a source/drain of a transistor that uses the first active pattern AP1 as a channel region. The second epitaxial pattern 250 may be included in a source/drain of a transistor that uses the second active pattern AP2 as a channel region. The third epitaxial pattern 350 may be included in a source/drain of a transistor that uses the third active pattern AP3 as a channel region.

According to an exemplary embodiment of the inventive concept, an etching stop film may be further formed on the first to third epitaxial patterns 150, 250, and 350.

According to an exemplary embodiment of the inventive concept, an epitaxial pattern may be placed on the fourth to sixth active patterns AP4 to AP6.

The gate separation structure GCS may be formed along the first direction D1. The gate separation structure GCS may separate each of the first to third gate structures GS1 to GS3. For example, the gate separation structure GCS separates the gate electrodes 120 included in the gate structures GS1 to GS3. The gate separation structure GCS may be placed, for example, on the field insulating film 105 that fills the deep trench DT.

Each of the first to third gate structures GS1 to GS3 may be placed between the gate separation structures GCS spaced from each other in the second direction D2. The gate separation structure GCS may face a short side of the gate electrode 120 extending in the first direction D1. The short side of the gate electrode 120 may be referred to as a first side.

Figure 4:
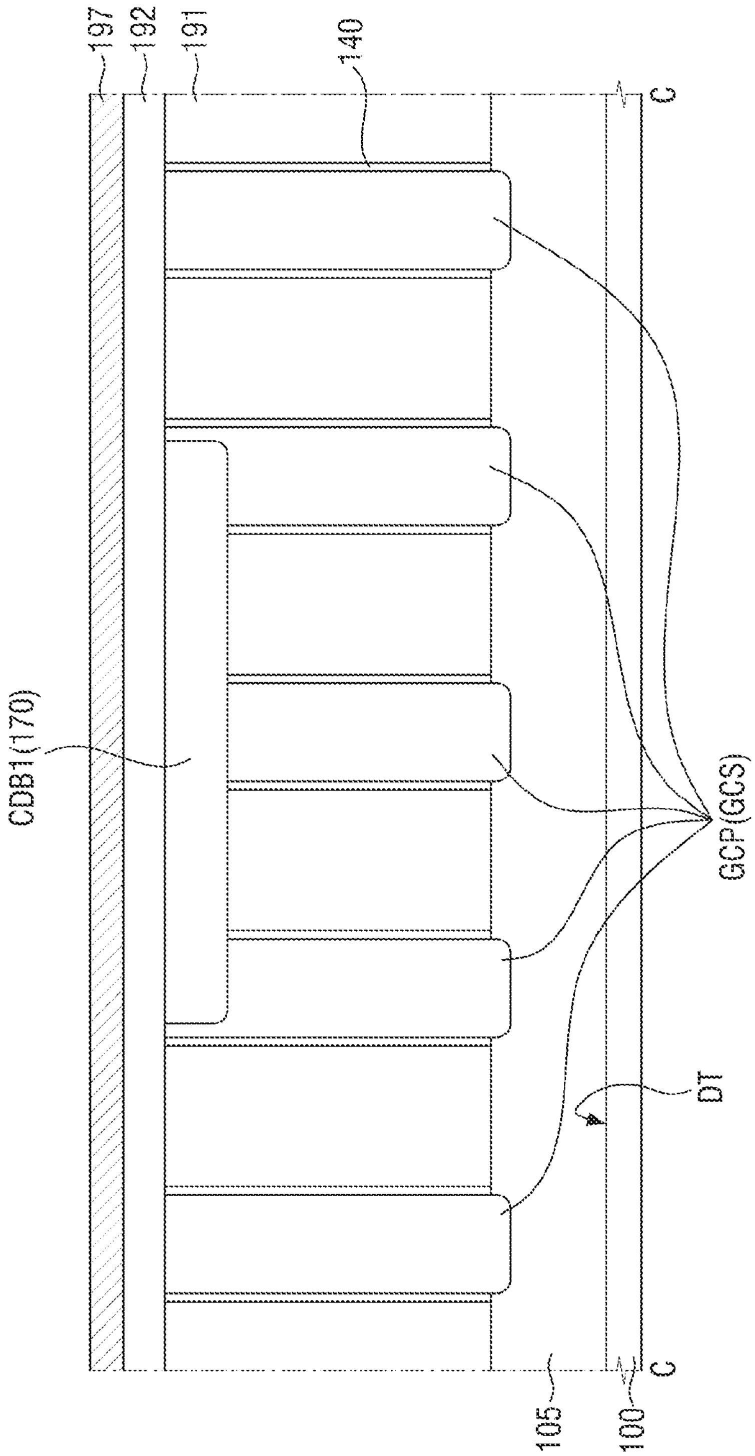

In the semiconductor device according to exemplary embodiments of the inventive concept, the gate separation structure GCS may include a plurality of gate separation patterns GCP arranged in the first direction D1 and spaced apart from each other, as shown in FIG. 4. A part of the gate separation patterns GCP may be placed at a position facing the gate electrode 120 in the second direction D2. Additionally, the rest of the gate separation patterns GCP may be placed at a position of the element separation structure DCS facing a first extended separation structure DB1 and a first extended separation structure DB2 to be described below in the second direction D2. A first interlayer insulating film 191 may be placed between the gate separation patterns GCP spaced apart from each other in the first direction D1.

The gate spacer 140 extending in the second direction D2 may be placed on side walls of each gate separation pattern GCP. The gate spacer 140 placed on the side walls of the gate electrode 120 may extend in the second direction D2 and may be placed on the side walls of the gate separation pattern GCP. Additionally, the gate spacers 140 placed on the side walls of the first extended separation structure DB1 and the first extended separation structure DB2 may extend in the second direction, and may be placed on the side walls of the gate separation pattern GCP. Alternatively, unlike the shown case, the gate spacers 140 may not be placed on the side walls of each gate separation pattern GCP.

An upper surface of the gate separation structure GCS may be placed on the same plane as an upper surface 145*us* of the gate capping pattern 145. In other words, the upper surface of the gate separation pattern GCP may be placed on the same plane as the upper surface 145*us* of the gate capping pattern 145.

A bottom surface of the gate separation pattern GCP may be closer to the substrate 100 than a bottom surface of the gate spacer 140. In other words, the bottom surface of the gate separation pattern GCP may be lower than the upper surface of the field insulating film 105. Alternatively, unlike the shown case, the bottom surface of the gate separation pattern GCP may be located at the same level as the bottom surface of the gate spacer 140.

In the semiconductor device according to exemplary embodiments of the inventive concept, the gate insulating film 130 may be placed between the gate electrode 120 and the gate separation structure GCS. The gate insulating film 130 may extend along side walls of the gate separation structure GCS. The gate electrode 120 and the gate separation structure GCS may be separated by the gate insulating film 130.

The gate separation pattern GCP may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide (AlO), or combinations thereof. Although each gate separation pattern GCP is shown as a single film, the inventive concept is not limited thereto.

The element separation structure DCS may include the first extended separation structure DB1 and the first extended separation structure DB2 extending in the second direction D2, and a second extended separation structure CDB1 and a second extended separation structure CDB2 extending in the first direction D1. For example, the first extended separation structure DB1 and the first extended separation structure DB2 may be connected to the second extended separation structure CDB1 and the second extended separation structure CDB2, respectively. For reference, the first extended separation structure DB1, the first extended separation structure DB2, the second extended separation structure CDB1, and the second extended separation structure CDB2 may be referred to as the first, second, third, and fourth extended separation structures, respectively.

In the semiconductor device according to exemplary embodiments of the inventive concept, the element separation structure DCS may have a closed-loop shape.

In the semiconductor device according to exemplary embodiments of the inventive concept, the first extended separation structure DB1 and the first extended separation structure DB2 may be directly connected to the second extended separation structure CDB1. Additionally, the first extended separation structure DB1 and the first extended separation structure DB2 may be directly connected to the second extended separation structure CDB2.

The first extended separation structure DB1 and the first extended separation structure DB2 may be spaced apart from each other in the first direction D1. The first extended separation structure DB1 and the first extended separation structure DB2 may be spaced apart from the gate structures GS1, GS2, and GS3 in the first direction D1.

The first extended separation structure DB1 may separate the first active pattern AP1 and the second active pattern AP2. The first extended separation structure DB1 may be placed between the first epitaxial pattern 150 and the second epitaxial pattern 250. The first extended separation structure DB1 may be placed between the first epitaxial pattern 150 closest (e.g., adjacent) to the second active pattern AP2 and the second epitaxial pattern 250 closest (e.g., adjacent) to the first active pattern AP1.

The first extended separation structure DB1 may be in contact with the gate separation structure GCS. A short side of the first extended separation structure DB1 may be in contact with the gate separation structure GCS. For example, the first extended separation structure DB1 may be in contact with the gate separation pattern GCP facing in the second direction D2.

According to an exemplary embodiment of the inventive concept, the first extended separation structure DB1 may separate the fourth active pattern AP4 and the fifth active pattern AP5.

The first extended separation structure DB2 may separate the second active pattern AP2 and the third active pattern AP3. The first extended separation structure DB2 may be placed between the second epitaxial pattern 250 and the third epitaxial pattern 350. The first extended separation structure DB2 may be placed between the second epitaxial pattern 250 closest to the third active pattern AP3 and the third epitaxial pattern 350 closest to the second active pattern AP2.

The first extended separation structure DB2 may be in contact with the gate separation structure GCS. A short side of the first extended separation structure DB2 may be in contact with the gate separation structure GCS. For example, the first extended separation structure DB2 may be in contact with the gate separation pattern GCP facing in the second direction D2.

According to an exemplary embodiment of the inventive concept, the first extended separation structure DB2 may separate the fourth active pattern AP4 and the fifth active pattern AP5.

The first extended separation structure DB1 and the first extended separation structure DB2 may each include a core separation pattern 170 and a separation side wall pattern 175. The separation side wall pattern 175 may be placed on the side wall of the core separation pattern 170.

The core separation pattern 170 may extend in the second direction D2. The core separation pattern 170 of the first extended separation structure DB1 may separate the first active pattern AP1 and the second active pattern AP2. Additionally, the core separation pattern 170 of the first extended separation structure DB2 may separate the second active pattern AP2 and the third active pattern AP3. Similarly, the core separation pattern 170 may separate the fourth to sixth active patterns AP4 to AP6.

Figure 5:
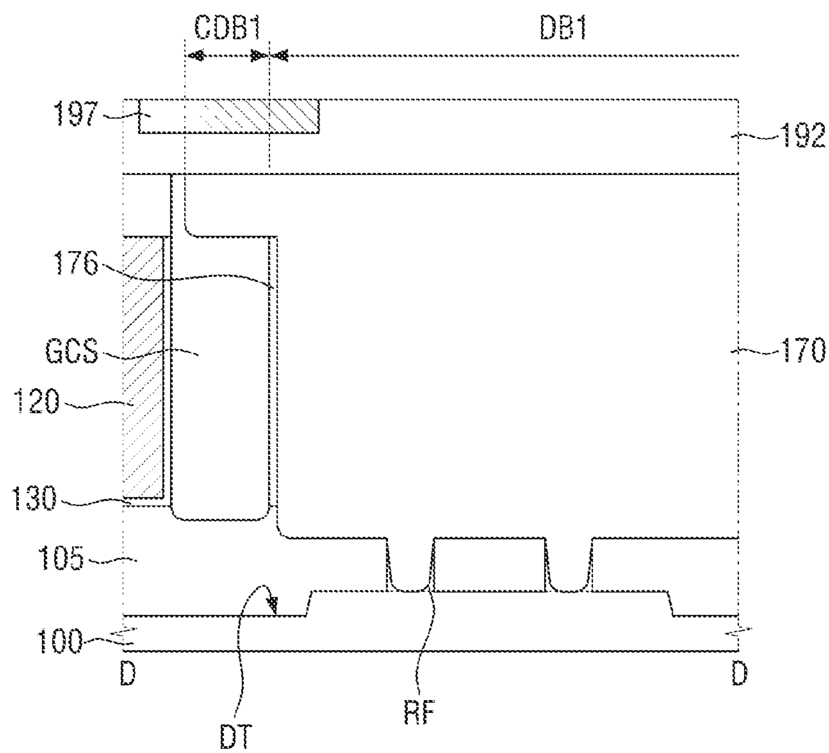
Figure 6:
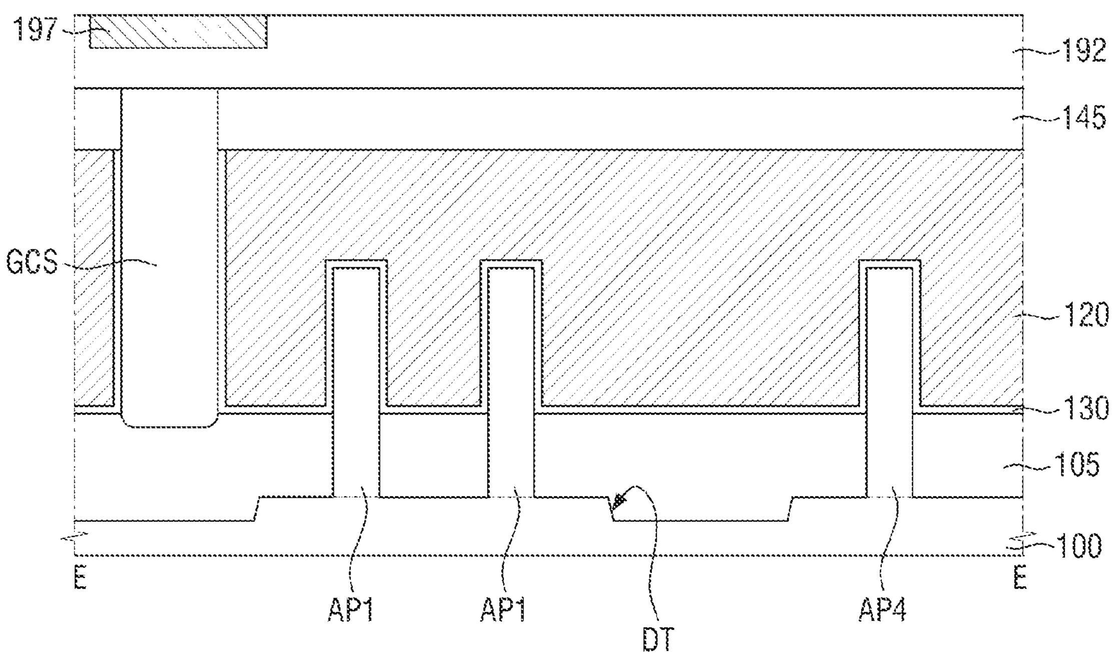

In FIGS. 2 and 5, although a depth from the upper surface of the second active pattern AP2 to the lowest part of the core separation pattern 170 is shown as the same as the height of the first to third active patterns AP1 to AP3, the inventive concept is not limited thereto. Unlike the shown case, as an example, the depth from the upper surface of the second active pattern AP2 to the lowest part of the core separation pattern 170 may be smaller than the height of the first to third active patterns AP1 to AP3. As another example, the depth from the upper surface of the second active pattern AP2 to the lowest part of the core separation pattern 170 may be greater than the height of the first to third active patterns AP1 to AP3.

A bottom surface of the core separation pattern 170 may be defined by the field insulating film 105, the substrate 100, and a remaining active pattern RF. The remaining active pattern RF may be a portion that is left after the active pattern portion is removed in the etching process for forming the core separation pattern 170. Alternatively, unlike the shown case, there may be no remaining active pattern RF.

During the etching process for forming the core separation pattern 170, a part of the field insulating film 105 is removed, and the upper surface of the field insulating film 105 facing the bottom surface of the core separation pattern 170 may be lowered. For example, the upper surface of the field insulating film 105 facing the bottom surface of the core separation pattern 170 may be lower than the upper surface of the field insulating film 105 facing the bottom surface of the gate electrode 120.

An upper surface **170*us* of the core separation pattern may be placed on the same plane as the upper surfaces of the gate structures GS1 to GS3. The upper surface of the gate structure GS1 to GS3 may be the upper surface 145*us* of the gate capping pattern 145. In other words, the upper surface 170*us* of the core separation pattern may be placed on the same plane as the upper surface 145*us* of the gate capping pattern 145**.

The core separation pattern 170 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), aluminum oxide (AlO), or combinations thereof.

The separation side wall pattern 175 may include a high dielectric constant liner 176 and a conductive separation liner 177. The conductive separation liner 177 may be placed between the high dielectric constant liner 176 and the core separation pattern 170.

The high dielectric constant liner 176 may include a high dielectric constant dielectric film that includes a metal. Considering the fabricating process, since the high dielectric constant liner 176 remains after the gate insulating film 130 is etched, the high dielectric constant liner 176 may include the material included in the gate insulating film 130.

Considering the fabricating process, the conductive separation liner 177 may remain after the gate electrode 120 is etched. The conductive separation liner 177 may include the material included in the gate electrode 120.

The core separation pattern 170 may include a first side wall **170_*s*1 and a second side wall 170_*s*2 that are opposite to each other. The separation side wall pattern 175 may be placed on at least one of the first side wall 170_*s*1 and the second side wall 170_*s*2**.

In FIGS. 7 and 8, the separation side wall pattern 175 may be placed on the first side wall **170_*s*1 of the core separation pattern 170 and the second side wall 170_*s*2 of the core separation pattern 170. Meanwhile, in FIG. 9, the separation side wall pattern 175 may be placed on the first side wall 170_*s*1 of the core separation pattern 170. However, the separation side wall pattern 175 is not placed on the second side wall 170**_*s*2 of the core separation pattern 170.

In FIGS. 7 to 9, the separation side wall pattern 175 on the first side wall 170_*s*1 of the core separation pattern 170 may include an L-shaped high dielectric constant liner 176. For example, the high dielectric constant liner 176 may include a bottom part 176L extending in the first direction D1, which is an extension direction of the second active pattern AP2, and a vertical extension part 176V extending in the third direction D3 which is a thickness direction of the substrate 100.

The bottom part 176L of the high dielectric constant liner 176 may include a first end and a second end that are spaced apart from each other in the first direction D1. The vertical extension part 176V of the high dielectric constant liner 176 may extend from the first end of the bottom part 176L of the high dielectric constant liner 176 toward the third direction D3. The first end of the bottom part 176L of the high dielectric constant liner 176 may face the side wall of the core separation pattern 170. The bottom part 176L of the high dielectric constant liner 176 may be interposed between the second active pattern AP2 and the conductive separation liner 177.

In FIG. 7, the L-shaped high dielectric constant liner 176 may be placed on the first side wall 170_*s*1 of the core separation pattern 170 and the second side wall 170_*s*2 of the core separation pattern 170.

In FIG. 8, the L-shaped high dielectric constant liner 176 may be placed on the first side wall 170_*s*1 of the core separation pattern 170. On the other hand, the L-shaped high dielectric constant liner 176 is not placed on the second side wall 170_*s*2 of the core separation pattern 170.

In FIG. 5, the high dielectric constant liner 176 extending along the side wall of the gate separation structure GCS may be placed between the core separation pattern 170 and the gate separation structure GCS.

Since the separation side wall pattern 175 remains after etching the gate electrode 120 and the gate insulating film 130, the separation side wall pattern 175 may be placed on a part of the side walls of the core separation pattern 170. The upper surface of the separation side wall pattern 175 is lower than the upper surface 170*us* of the core separation pattern 170.

Each of the first extended separation structure DB1 and the first extended separation structure DB2 may have a shape selected from FIGS. 7 to 9. In other words, the shape of the first extended separation structure DB1 may be the same as or different from the shape of the first extended separation structure DB2.

Since the core separation pattern 170 is formed to penetrate the gate capping pattern 145, a cut gate capping pattern 145_*c* may be placed on the side wall of the core separation pattern 170, as shown in FIG. 2. Additionally, the gate spacer 140 may be placed on the first side wall 170_*s*1 of the core separation pattern 170 and the second side wall 170_*s*2 of the core separation pattern 170.

The second extended separation structure CDB1 and the second extended separation structure CDB2 may be spaced apart from each other in the second direction D2. The second extended separation structure CDB1 and the second extended separation structure CDB2 may be placed on the gate separation structure GCS.

The second extended separation structure CDB1 and the second extended separation structure CDB2 may be placed on a part of the gate separation structure GCS formed in the first direction D1. The second extended separation structure CDB1 and the second extended separation structure CDB2 may be placed on some of the plurality of gate separation patterns GCP.

The second extended separation structure CDB1 and the second extended separation structure CDB2 may each have a line shape extending in the first direction D1. In FIG. 4, the plurality of gate separation patterns GCP may protrude from a bottom surface of the second extended separation structure CDB1 extending in the first direction D1 toward the substrate 100. The first interlayer insulating film 191 is interposed between the second extended separation structure CDB1 and the field insulating film 105.

In the semiconductor device according to exemplary embodiments of the inventive concept, the width of the second extended separation structure CDB1 in the second direction D2 may be smaller than the width of the gate separation structure GCS in the second direction D2. The upper surface of the second extended separation structure CDB1 may be placed on the same plane as the upper surface of the gate separation structure GCS and the upper surface 145*us* of the gate capping pattern 145. The upper surface of the second extended separation structure CDB1 may be placed on the same plane as the upper surface of the first extended separation structure DB1.

Unlike the first extended separation structure DB1 and the first extended separation structure DB2, the second extended separation structure CDB1 and the second extended separation structure CDB2 do not include the separation side wall pattern 175. In the semiconductor device according to exemplary embodiments of the inventive concept, the film structures of the first extended separation structure DB1 and the first extended separation structure DB2 are different from the film structures of the second extended separation structure CDB1 and the second extended separation structure CDB2.

On the other hand, since the second extended separation structure CDB1 and the second extended separation structure CDB2 are formed at substantially the same time as the core separation pattern 170, each of the second extended separation structure CDB1 and the second extended separation structure CDB2 may have substantially the same film structure as the core separation pattern 170. The core separation patterns 170 included in the second extended separation structure CDB1, the second extended separation structure CDB2, the first extended separation structure DB1, and the first extended separation structure DB2 may have a closed-loop shape.

Here, when the core separation pattern 170 is a single film, the core separation pattern 170 may be formed of the same material as the second extended separation structure CDB1 and the second extended separation structure CDB2. When the core separation pattern 170 is a multi-film, the order of the stacked films included in the core separation pattern 170 may be the same as the order of the stacked films included in second extended separation structure CDB1 and second extended separation structure CDB2.

When the core separation pattern 170 and the gate separation structure GCS are formed of a single film, and the core separation pattern 170 and the gate separation structure GCS are formed of the same material, a boundary between the second extended separation structure CDB1 and the gate separation structure GCS may not be distinguished.

Although the single second gate structure GS2 is shown as being placed between the first extended separation structure DB1 and the first extended separation structure DB2, this is only for convenience of explanation, and the inventive concept is not limited thereto.

The source/drain contact 160 may be placed on the epitaxial patterns 150, 250, and 350. According to an exemplary embodiment of the inventive concept, a metal silicide film may be placed between the source/drain contact 160 and the epitaxial patterns 150, 250, and 350.

In FIG. 2, the upper surfaces of the source/drain contacts 160 may be different from one another. The upper surface of the drain contact 160 that is connected to the wiring structure 195 of BEOL (Back-End-Of-Line) is higher than the upper surface of the drain contact 160 that is not connected to the wiring structure 195.

The first interlayer insulating film 191 may be placed on the field insulating film 105. The first interlayer insulating film 191 may surround the side walls of the gate structures GS1 to GS3. The upper surface of the first interlayer insulating film 191 may be placed on the same plane as the upper surface 145*us* of the gate capping pattern 145.

A second interlayer insulating film 192 may be placed on the first interlayer insulating film 191. Each of the first interlayer insulating film 191 and the second interlayer insulating film 192 may include, for example, but is not limited to, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or a combination thereof.

The wiring structure 195 may be placed in the second interlayer insulating film 192. The wiring structure 195 may include a via 196 and a line wiring 197. The via 196 and the line wiring 197 may include a conductive material.

Figure 10:
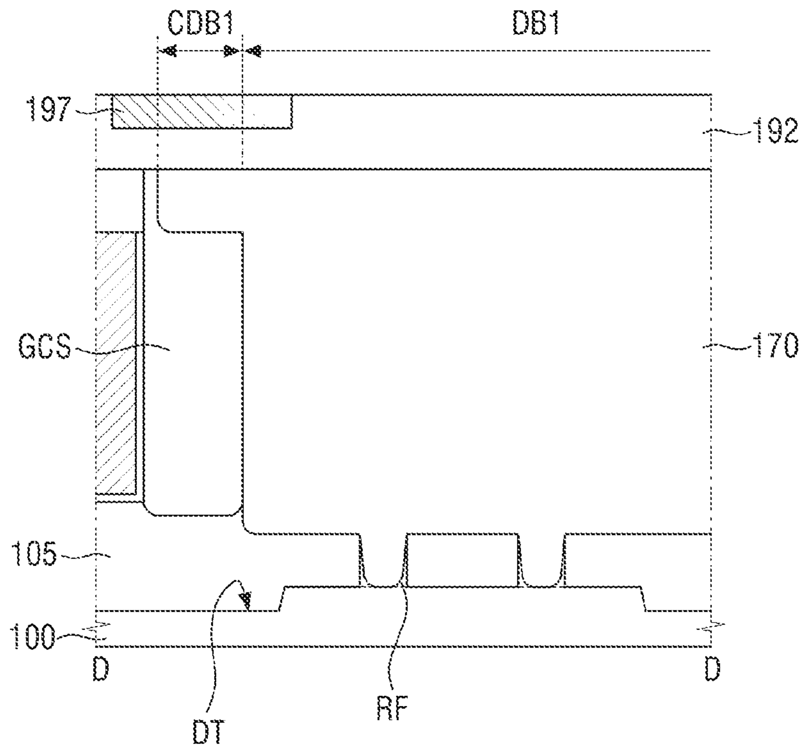
FIG. 10 is a diagram for explaining a semiconductor device according to an exemplary embodiment of the inventive concept.
Figure 11:
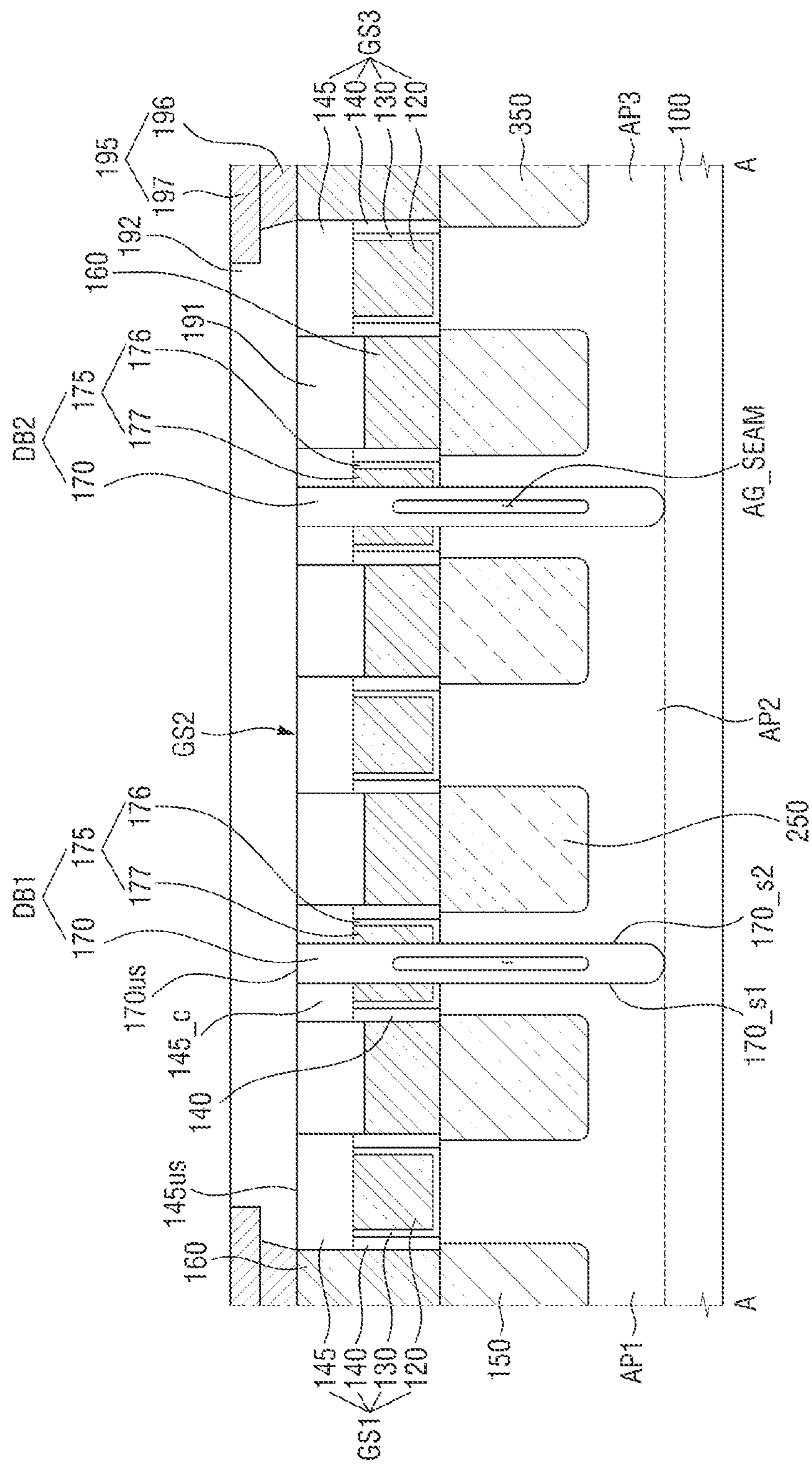
FIG. 11 is a diagram for explaining a semiconductor device according to an exemplary embodiment of the inventive concept.

FIG. 10 is a diagram for explaining a semiconductor device according to exemplary embodiments of the inventive concept. FIG. 11 is a diagram for explaining a semiconductor device according to exemplary embodiments of the inventive concept. For convenience of explanation, elements different from those explained with reference to FIGS. 1 to 9 will be mainly described.

Referring to FIG. 10, in the semiconductor device according to exemplary embodiments of the inventive concept, the high dielectric constant liner 176 is not placed between the core separation pattern 170 and the gate separation structure GCS.

During the etching process of forming the core separation pattern 170, the gate insulating film (130 of FIG. 6) extending along the side walls of the gate separation structure GCS may be entirely removed.

Referring to FIG. 11, in the semiconductor device according to exemplary embodiments of the inventive concept, the first extended separation structure DB1 and the first extended separation structure DB2 may include an air gap AG_SEAM.

For example, the core separation pattern 170 may include the air gap AG_SEAM. The air gap AG_SEAM may be surrounded by the core separation pattern 170.

Figure 12:
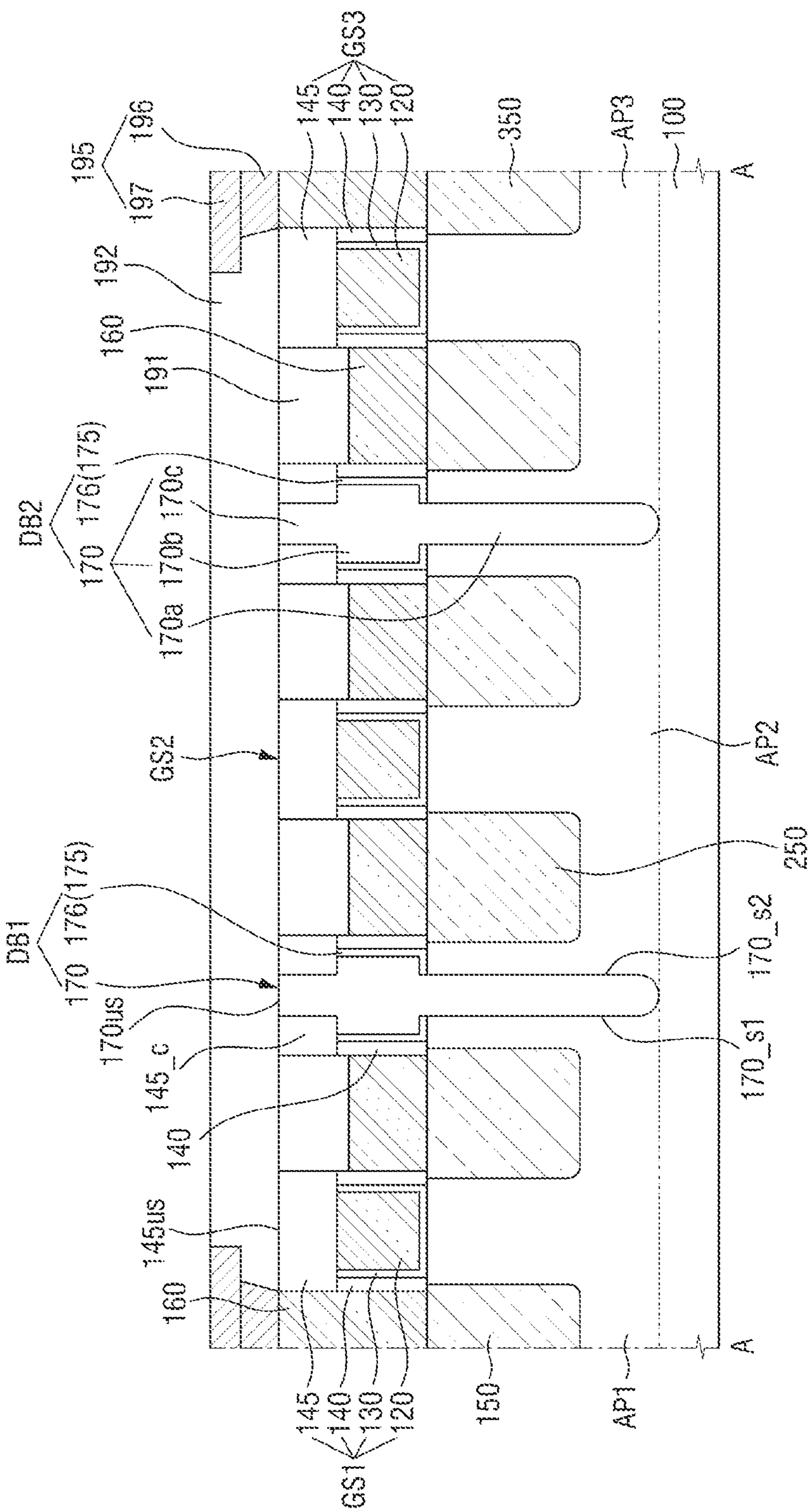
FIG. 12 is a diagram for explaining a semiconductor device according to an exemplary embodiment of the inventive concept.
Figure 13:
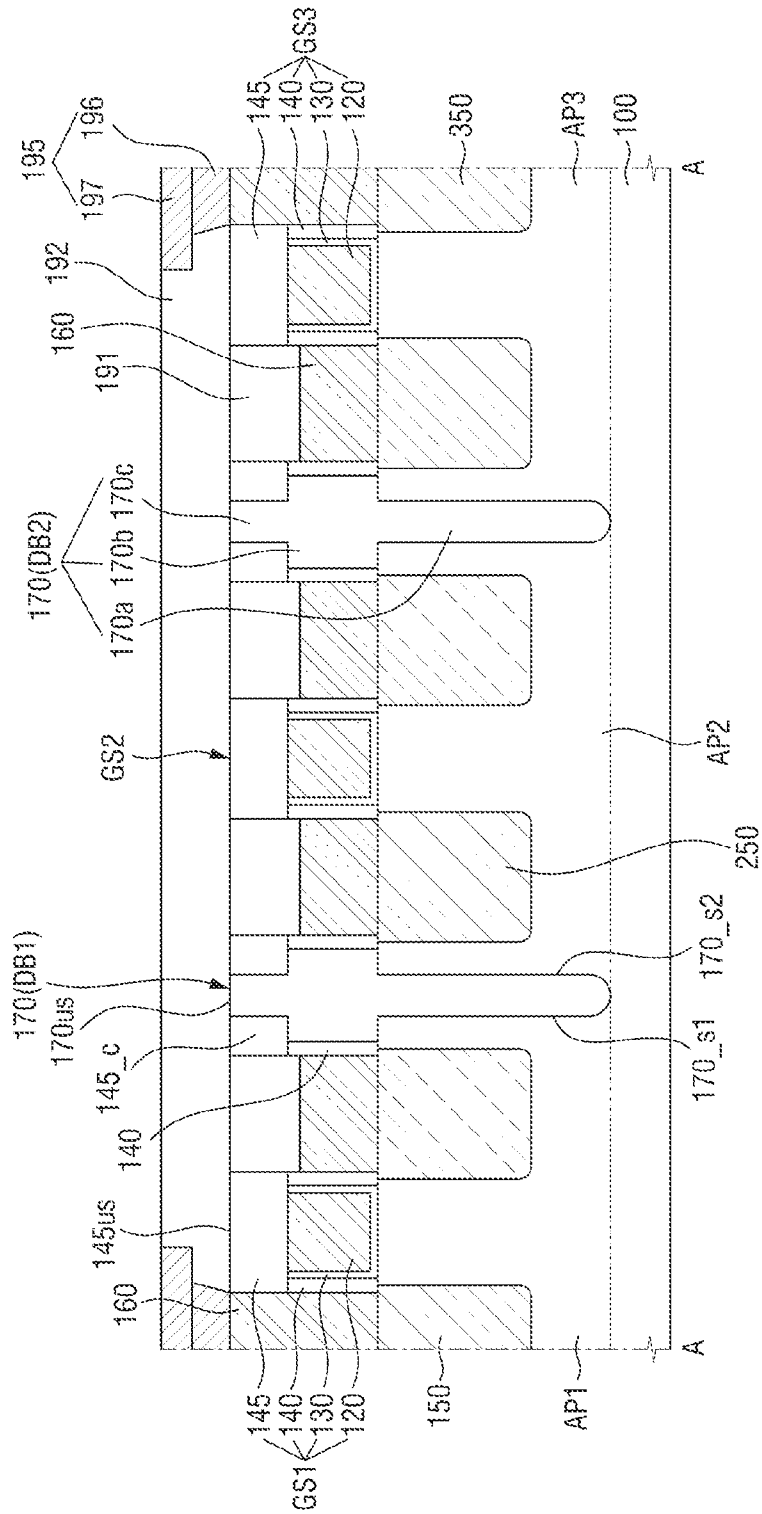
FIG. 13 is a diagram for explaining a semiconductor device according to an exemplary embodiment of the inventive concept.

FIG. 12 is a diagram for explaining a semiconductor device according to exemplary embodiments of the inventive concept. FIG. 13 is a diagram for explaining a semiconductor device according to exemplary embodiments of the inventive concept. For convenience of explanation, elements different from those explained with reference to FIGS. 1 to 9 will be mainly described.

Referring to FIG. 12, in the semiconductor device according to exemplary embodiments of the inventive concept, the separation side wall pattern 175 may include only the high dielectric constant liner 176.

During the process of forming the core separation pattern 170, the gate electrode (120 of FIG. 2) may be entirely removed.

The core separation pattern 170 may include a lower part 170*a*, a width expansion part 170*b*, and an upper part 170*c*. The width expansion part 170*b* may be disposed on an upper surface of an active pattern (e.g., the first active pattern AP1). The width expansion part 170*b* of the core separation pattern 170 may be placed on the lower part 170*a* of the core separation pattern 170. The upper part 170*c* of the core separation pattern 170 may be placed on the width expansion part 170*b* of the core separation pattern 170.

A lower surface of the width expansion part 170*b* of the core separation pattern 170 may be in contact with the high dielectric constant liner 176. The upper surface of the width expansion part 170*b* of the core separation pattern may be in contact with the cut gate capping pattern 145_*c*.

A part of the width expansion part 170*b* of the core separation pattern 170 may extend over the bottom part (176L of FIG. 7) of the high dielectric constant liner 176 having an L shape.

Referring to FIG. 13, in the semiconductor device according to exemplary embodiments of the inventive concept, the first extended separation structure DB1 and the first extended separation structure DB2 may include only the core separation pattern 170.

During the process of forming the core separation pattern 170, both the gate electrode (120 of FIG. 2) and the gate insulating film (130 of FIG. 2) may be removed.

The core separation pattern 170 may include the lower part 170*a*, the width expansion part 170*b*, and the upper part 170*c*. The width expansion part 170*b* of the core separation pattern 170 may be placed on the lower part 170*a* of the core separation pattern 170. The upper part 170*c* of the core separation pattern 170 may be placed on the width expansion part 170*b* of the core separation pattern 170.

At a region boundary between the width expansion part 170*b* and the upper part 170*c*, the width of the width expansion part 170*b* in the first direction D1 is greater than the width of the upper part 170*c* in the first direction D1. On the basis of (e.g., with respect to) the upper surface of the second active pattern AP2, the region boundary between the width expansion part 170*b* and the upper part 170*c* may have substantially the same height as the upper surface of the gate electrode 120. The upper surface of the width expansion part 170*b* may be in contact with the cut gate capping pattern 145_*c*.

Since the first extended separation structure DB1 and the first extended separation structure DB2 include only the core separation pattern 170, the film structures of the first extended separation structure DB1 and the first extended separation structure DB2 may substantially be the same as the film structures of the second extended separation structure CDB1 and the second extended separation structure CDB2.

However, when the core separation pattern 170 includes an air gap (e.g., AG_SEAM of FIG. 11), the second extended separation structure CDB1 and the second extended separation structure CDB2 may not include the air gap.

Figure 14:
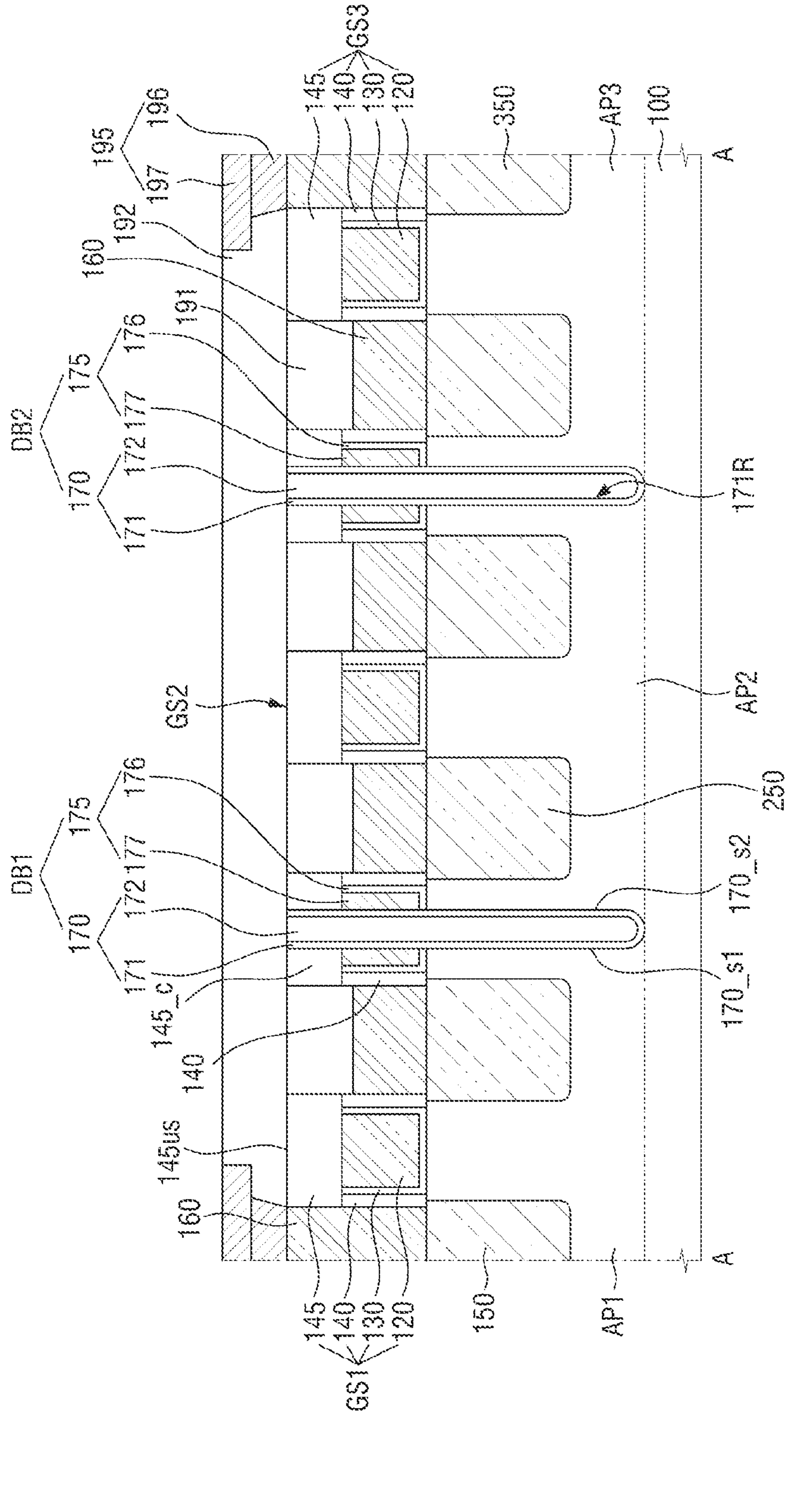
FIGS. 14 to 16 are diagrams for explaining a semiconductor device according to exemplary embodiments of the inventive concept.
Figure 15:
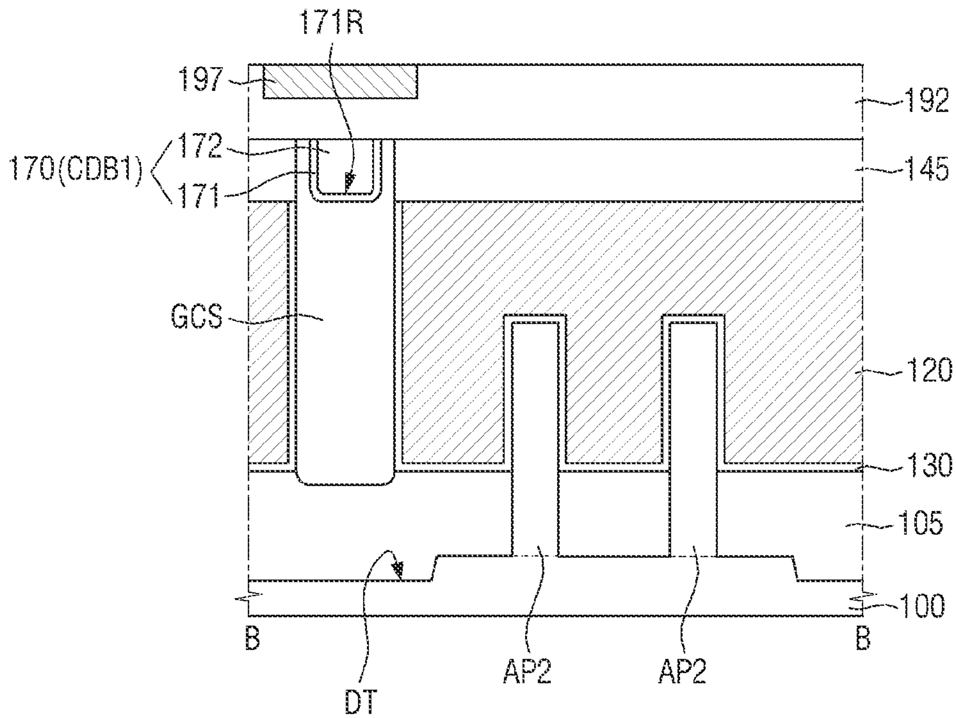
Figure 16:
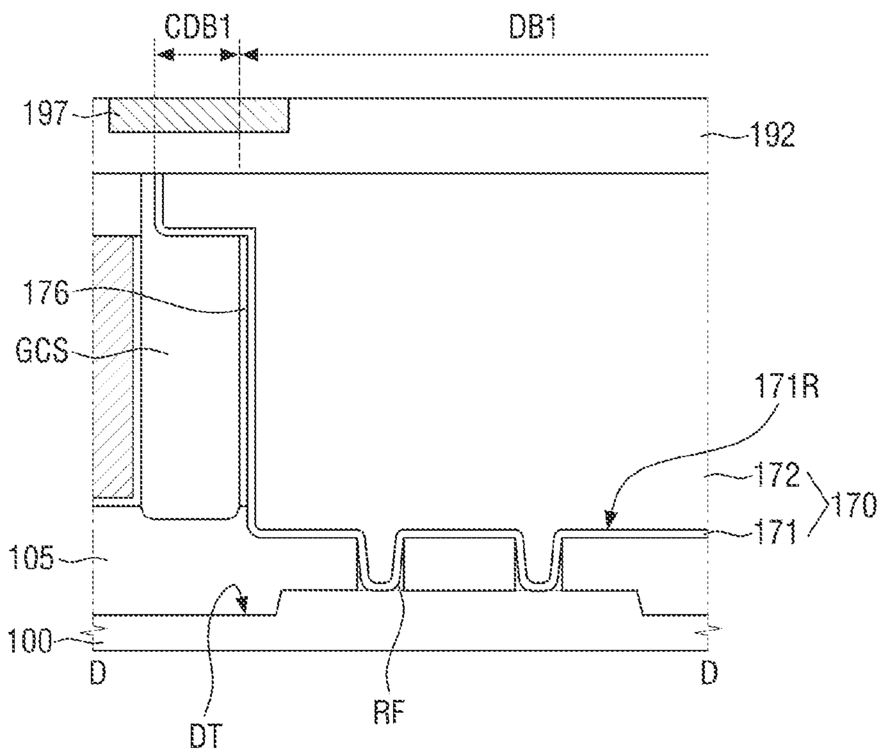

FIGS. 14 to 16 are diagrams for explaining a semiconductor device according to exemplary embodiments of the inventive concept. For convenience of explanation, elements different from those explained with reference to FIGS. 1 to 9 will be mainly described.

Referring to FIGS. 14 to 16, in the semiconductor device according to exemplary embodiments of the inventive concept, the core separation pattern 170 may include a core separation liner 171 and a core filling pattern 172.

The core separation liner 171 may be formed on the substrate 100. The core separation liner 171 may define a filling separation trench 171R.

The core separation liner 171 may extend to the upper surface 145*u* of the gate capping pattern 145. The uppermost surface of the core separation liner 171 may be placed on the same plane as the upper surface 145*u* of the gate capping pattern 145.

The core filling pattern 172 may be placed on the core separation liner 171. The core filling pattern 172 may fill the filling separation trench 171R. The upper surface of the core filling pattern 172 may be placed on the same plane as the upper surface 145*us* of the gate capping pattern 145.

The first extended separation structure DB1, the first extended separation structure DB2, the second extended separation structure CDB1, and the second extended separation structure CDB2 include the core separation pattern 170. Therefore, the first extended separation structure DB1, the first extended separation structure DB2, the second extended separation structure CDB1, and the second extended separation structure CDB2 may include the core separation liner 171 and the core filling pattern 172.

Since the element separation structure DCS has a closed-loop shape, the core filling pattern 172 may also have a closed-loop shape.

The core separation liner 171 and the core filling pattern 172 may include materials different from each other.

Although the core separation pattern 170 is shown as having a double-film structure, this is only for convenience of explanation, and the inventive concept is not limited thereto. In other words, the core separation liner 171 may have a multi-film structure.

Figure 17:
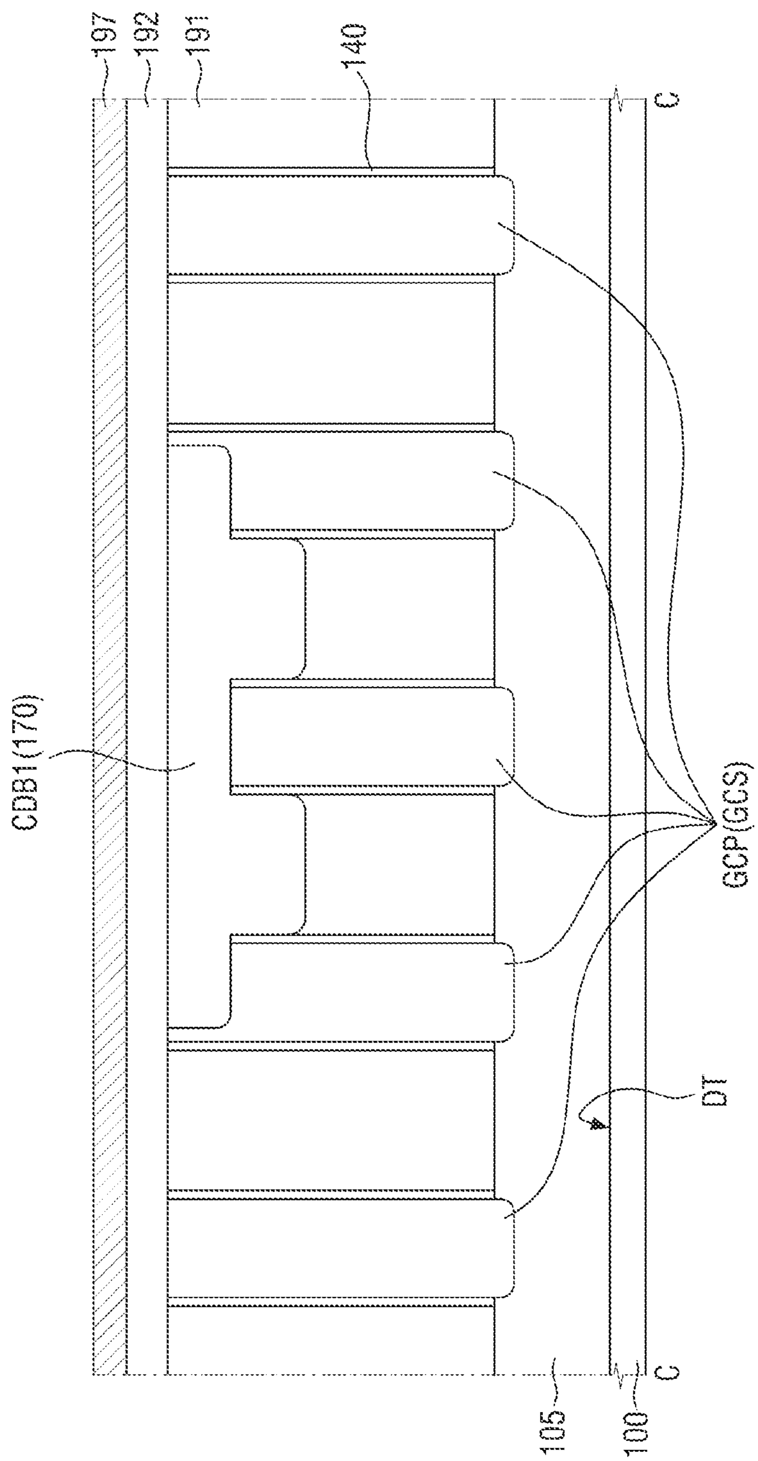
FIG. 17 is a diagram for explaining a semiconductor device according to an exemplary embodiment of the inventive concept.
Figure 18:
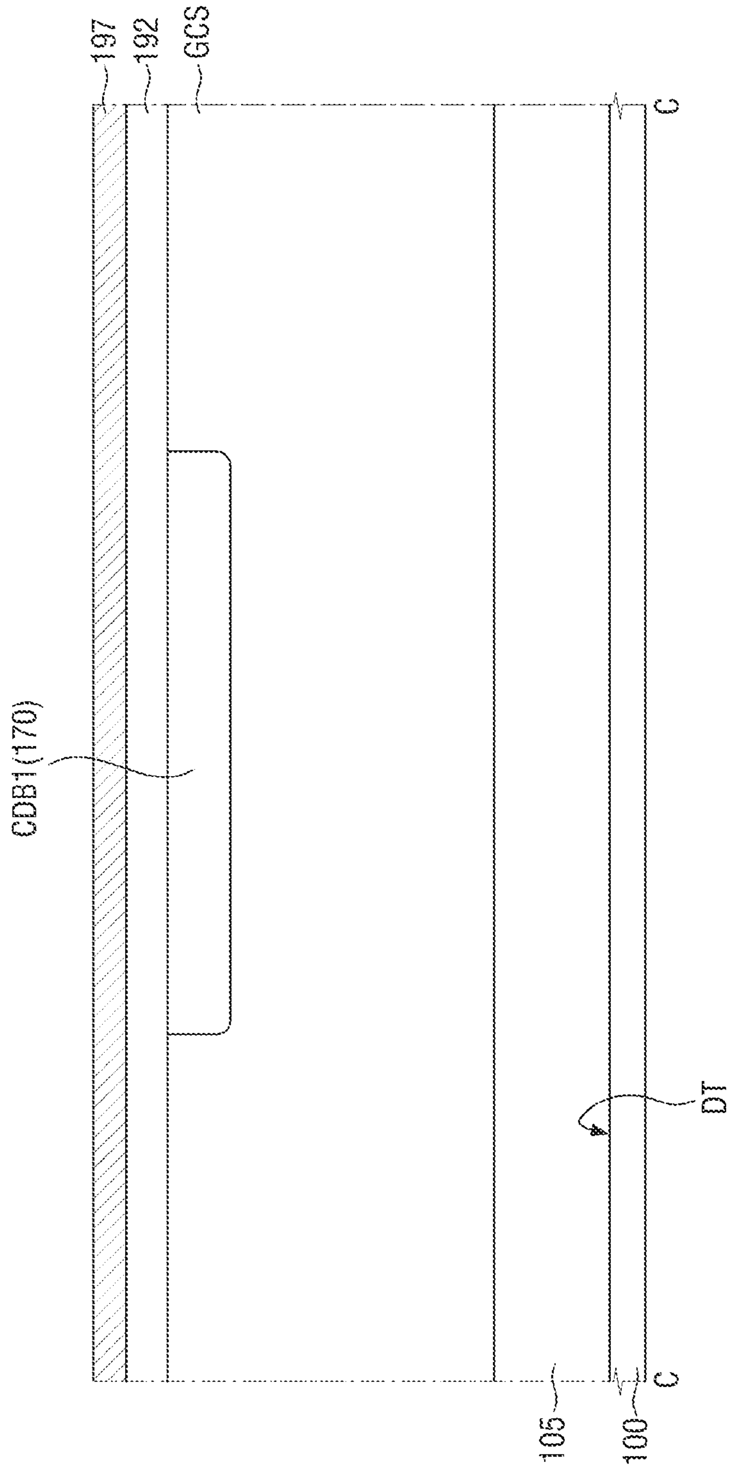
FIG. 18 is a diagram for explaining a semiconductor device according to an exemplary embodiment of the inventive concept.
Figure 19:
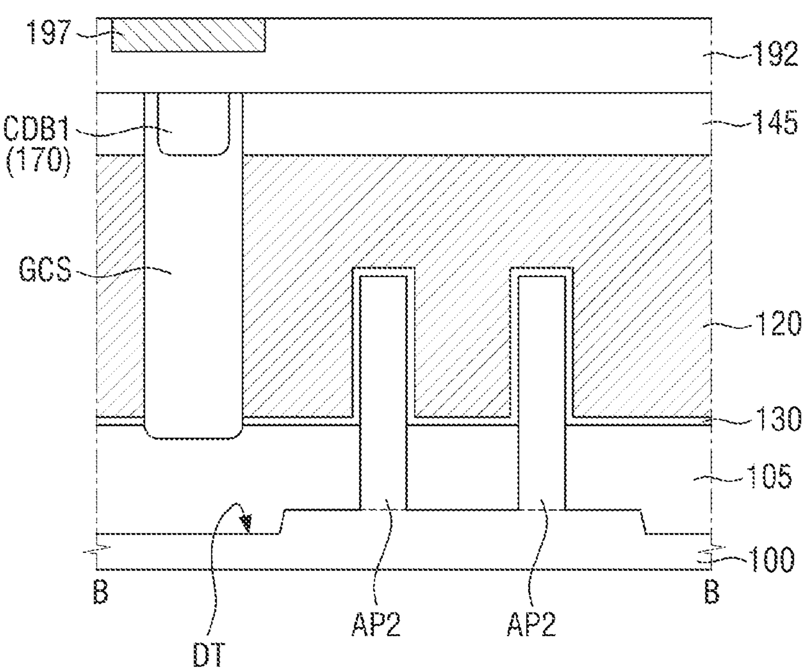
FIG. 19 is a diagram for explaining a semiconductor device according to an exemplary embodiment of the inventive concept.
Figure 20:
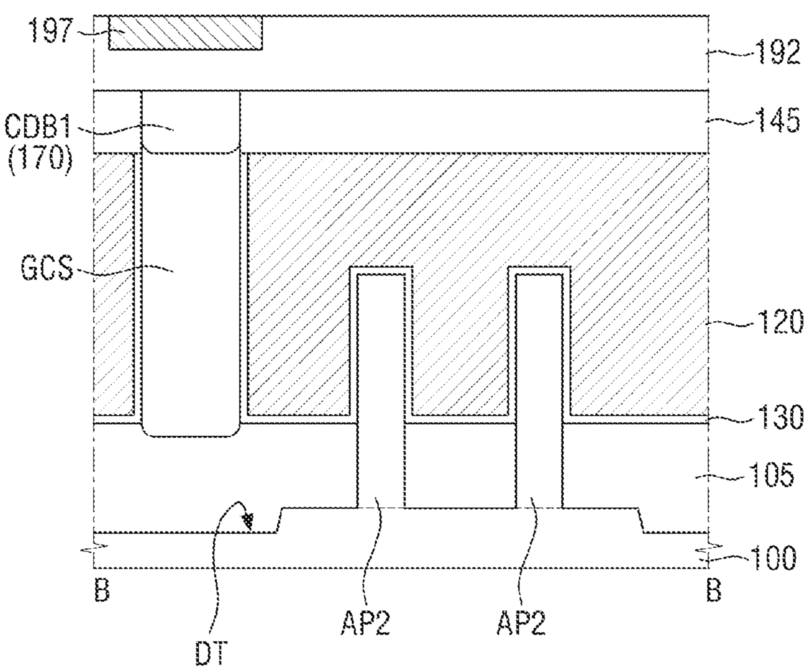
FIG. 20 is a diagram for explaining a semiconductor device according to an exemplary embodiment of the inventive concept.
Figure 21:
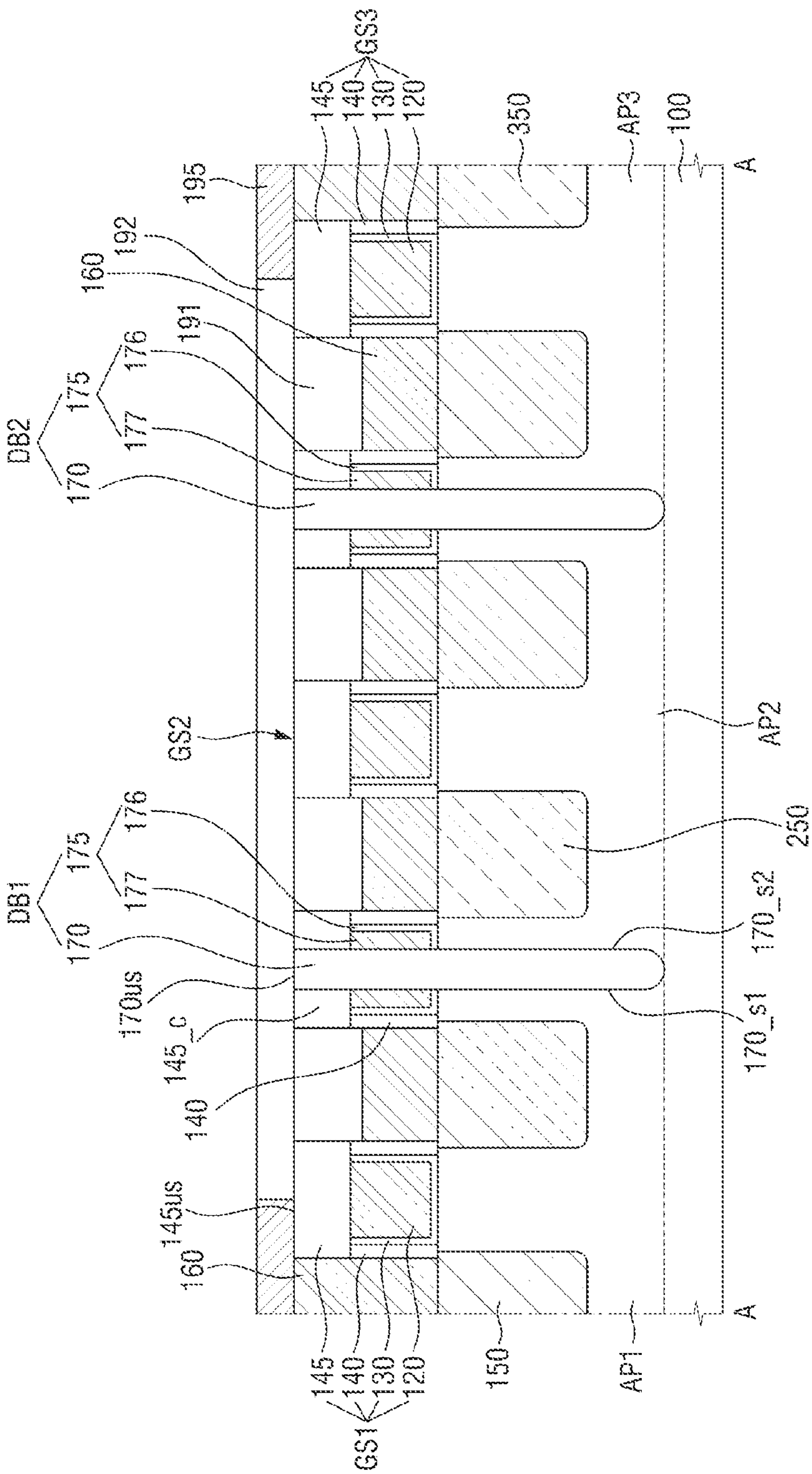
FIG. 21 is a diagram for explaining a semiconductor device according to an exemplary embodiment of the inventive concept.
Figure 22:
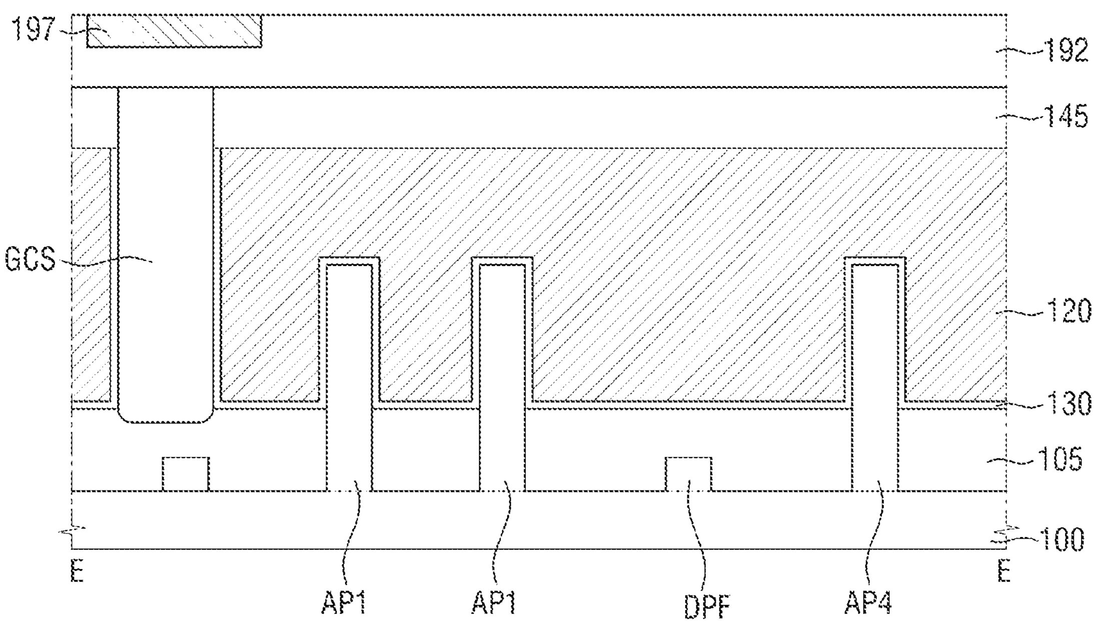
FIG. 22 is a diagram for explaining a semiconductor device according to an exemplary embodiment of the inventive concept.

FIG. 17 is a diagram for explaining a semiconductor device according to exemplary embodiments of the inventive concept. FIG. 18 is a diagram for explaining a semiconductor device according to exemplary embodiments of the inventive concept. FIG. 19 is a diagram for explaining a semiconductor device according to exemplary embodiments of the inventive concept. FIG. 20 is a diagram for explaining a semiconductor device according to exemplary embodiments of the inventive concept. FIG. 21 is a diagram for explaining a semiconductor device according to exemplary embodiments of the inventive concept. FIG. 22 is a diagram for explaining a semiconductor device according to exemplary embodiments of the inventive concept. For convenience of explanation, elements different from those explained with reference to FIGS. 1 to 9 will be mainly described.

Referring to FIG. 17, in the semiconductor device according to exemplary embodiments of the inventive concept, a bottom surface of the second extended separation structure CDB1 and a bottom surface of the second extended separation structure CDB2 may have unevenness.

For example, the upper surface of the second extended separation structure CDB1 may be placed on the same plane as the upper surface of the gate separation structure GCS and the upper surface of the first interlayer insulating film 191.

On the other hand, on the basis of the upper surface of the field insulating film 105, the height of the bottom surface of the second extended separation structure CDB1 of the portion that overlaps the gate separation pattern GCP may be different from the height of the bottom surface of the second extended separation structure CDB1 of the portion that overlaps the first interlayer insulating film 191.

An etching rate between the gate separation pattern GCP and the first interlayer insulating film 191 may be different during an etching process for forming the second extended separation structure CDB1. As a result, the bottom surface of the second extended separation structure CDB1 may have unevenness.

Alternatively, unlike the shown case, on the basis of the upper surface of the field insulating film 105, the height of the bottom surface of the second extended separation structure CDB1 of the portion which overlaps the gate separation pattern GCP may be lower than the height of the bottom surface of the second extended separation structure CDB1 of the portion which overlaps the first interlayer insulating film 191.

Referring to FIG. 18, in the semiconductor device according to exemplary embodiments of the inventive concept, the gate separation structure GCS may have a line shape elongated in the first direction (D1 of FIG. 1).

In the etching process of forming the gate separation structure GCS, by etching both the portion corresponding to the gate and the portion corresponding to the first interlayer insulating film (191 of FIG. 4), a line-shaped trench extending in the first direction D1 may be formed. The line-shaped trench may be filled with an insulating material to form the gate separation structure GCS having a line shape.

Referring to FIG. 19, in the semiconductor device according to exemplary embodiments of the inventive concept, the gate insulating film 130 may not extend along the side walls of the gate separation structure GCS.

The gate insulating film 130 is not placed between the short side of the gate electrode 120 and the side wall of the gate separation structure GCS.

In such a case, as shown in FIG. 10, the high dielectric constant liner (176 of FIG. 5) does not extend along the side walls of the gate separation structure GCS, between the first extended separation structure DB1 and the gate separation structure GCS.

Referring to FIG. 20, in the semiconductor device according to exemplary embodiments of the inventive concept, the width of the second extended separation structure CDB1 in the second direction D2 may be greater than or equal to the width of the gate separation structure GCS in the second direction D2.

Referring to FIG. 21, in the semiconductor device according to exemplary embodiments of the inventive concept, the wiring structure 195 does not include a via, but may include only a line-shaped line wiring.

This allows the wiring structure 195 to be in contact with the gate capping pattern 145.

Referring to FIG. 22, the semiconductor device according to exemplary embodiments of the inventive concept may include a protrusion pattern DPF protruding from the substrate 100, between the first active pattern AP1 and the fourth active pattern AP4.

The height of the protrusion pattern DPF is smaller than the height of the first active pattern AP1 and the height of the fourth active pattern AP4. The height of the protrusion pattern DPF is smaller than the height of the field insulating film 105 of the portion which overlaps the gate electrode 120. The protrusion pattern DPF may extend, for example, in the first direction (D1 of FIG. 1), but is not limited thereto.

The protrusion pattern DPF may also be placed under the gate separation structure GCS.

Figure 23:
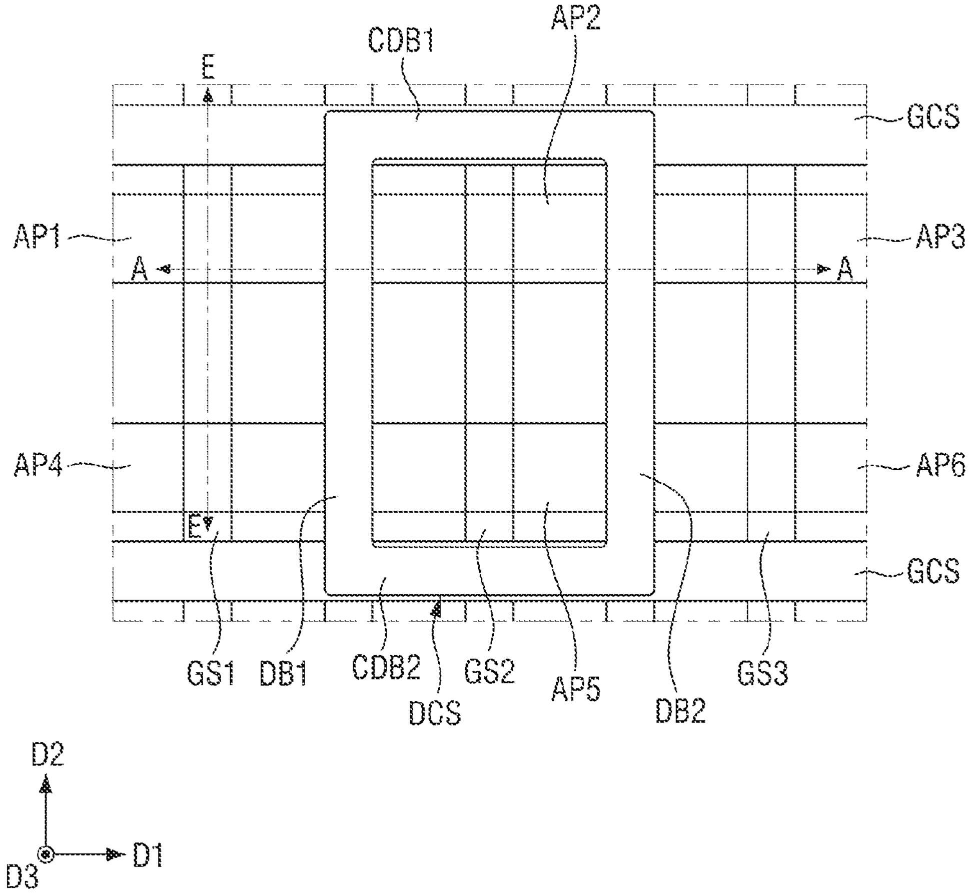
FIG. 23 is a layout view for explaining a semiconductor device according to an exemplary embodiment of the inventive concept.
Figure 24:
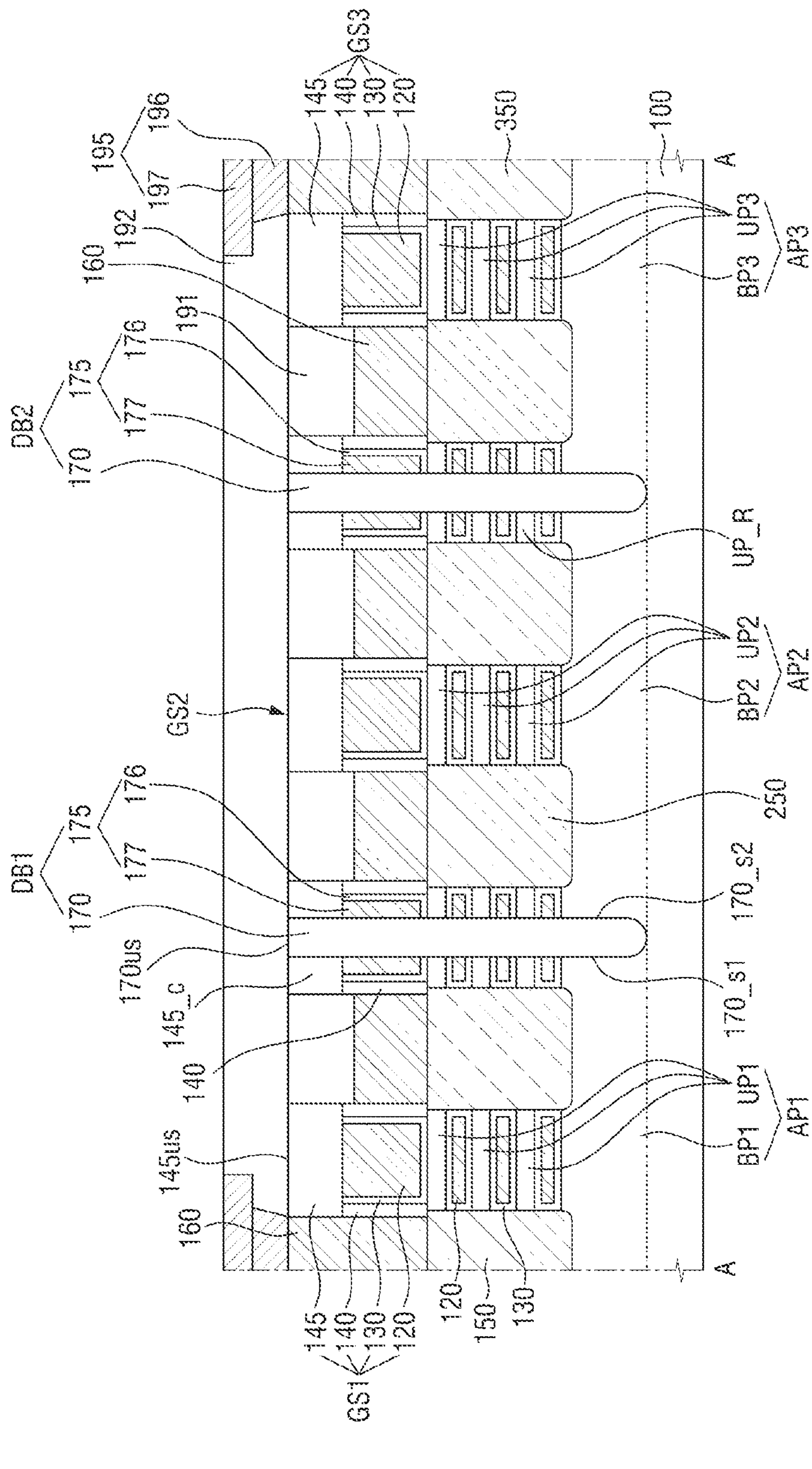
FIGS. 24 and 25 are cross-sectional views taken along lines A-A and E-E of FIG. 23 according to an exemplary embodiment of the inventive concept.
Figure 25:
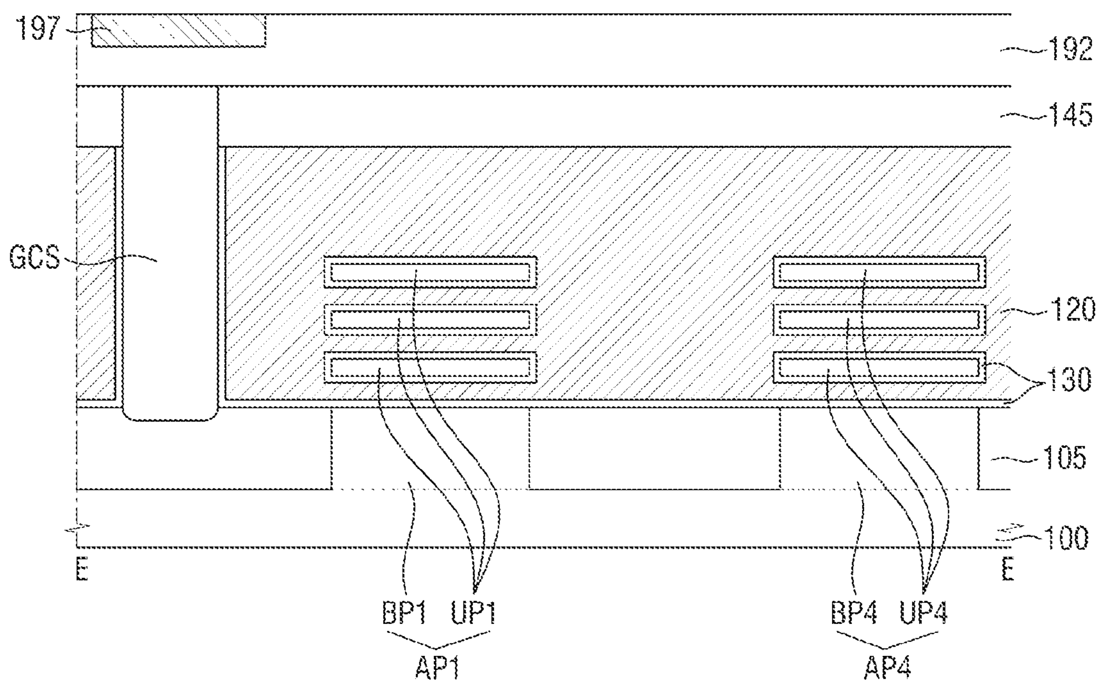

FIG. 23 is a layout view for explaining a semiconductor device according to exemplary embodiments of the inventive concept. FIGS. 24 and 25 are cross-sectional views taken along lines A-A and E-E of FIG. 23 according to exemplary embodiments of the inventive concept. For convenience of explanation, elements different from those explained with reference to FIGS. 1 to 9 will be mainly described.

Referring to FIGS. 23 to 25, in the semiconductor device according to exemplary embodiments of the inventive concept, the first to third active patterns AP1 to AP3 may include first to third lower patterns BP1 to BP3, respectively, and first to third sheet patterns UP1 to UP3, respectively.

According to an exemplary embodiment of the inventive concept, each of the fourth to sixth active patterns AP4 to AP6 may also include a lower pattern and a sheet pattern.

The first to third lower patterns BP1 to BP3 may be placed in a line along the first direction D1. The second lower pattern BP2 may be spaced apart from the first lower pattern BP1 and the third lower pattern BP3 in the first direction D1.

The first lower pattern BP1 and the second lower pattern BP2, and the second lower pattern BP2 and the third lower pattern BP3 may be separated by the first extended separation structure DB1 and the first extended separation structure DB2.

The first sheet pattern UP1 may be placed on the first lower pattern BP1 to be spaced apart from the first lower pattern BP1. The first sheet pattern UP1 may include a plurality of sheet patterns. Although the number of the first sheet patterns UP1 is shown as three, this is only for convenience of explanation, and the number thereof is not limited thereto. The second and third sheet patterns UP2 to UP3 may be similar to the first sheet pattern UP1.

Each of the first to third sheet patterns UP1 to UP3 may be connected to the first to third epitaxial patterns 150, 250, and 350. Each of the first to third sheet patterns UP1 to UP3 may be channel patterns used as a channel region of a transistor. For example, each of the first to third sheet patterns UP1 to UP3 may be a nanosheet or a nanowire.

Descriptions of the fourth to sixth active patterns AP4 to AP6 are substantially the same as that of the first to third active patterns AP1 to AP3, and are thus omitted.

Although two sheet patterns (e.g., the sheet pattern of the first active pattern AP1 and the sheet pattern of the fourth active pattern AP4) arranged in the second direction D2 are shown between the gate separation structures GCS adjacent to each other in the second direction D2, this is only for convenience of explanation, and the number thereof is not limited thereto.

The first to third gate structures GS1 to GS3 may be placed on the lower patterns of the first to sixth active patterns AP1 to AP6. The gate insulating films 130 and the gate electrodes 120 of the first to third gate structures GS1 to GS3 may surround the first to third sheet patterns UP1 to UP3. According to an exemplary embodiment of the inventive concept, the gate insulating films 130 and the gate electrodes 120 of the first to third gate structures GS1 to GS3 may surround the sheet patterns of the fourth to sixth active patterns AP4 to AP6.

In FIGS. 23 and 24, although the gate insulating film 130 between the sheet patterns UP1 to UP3 adjacent to each other in the third direction D3 is shown as being in contact with the first to third epitaxial patterns 150, 250, and 350, the inventive concept is not limited thereto. Unlike the shown case, an inner spacer may be placed between the gate insulating film 130 and the first to third epitaxial patterns 150, 250, and 350, and/or between the sheet patterns UP1 to UP3 adjacent to each other in the third direction D3.

A cut sheet pattern UP_R may be placed on the first side wall 170_s1 of the core separation pattern 170 and the second side wall 170_s2 of the core separation pattern 170. The cut sheet pattern UP_R may be a pattern which is left after some of the sheet patterns UP1 to UP3 are removed in the etching process for forming the element separation structure DCS.

A part of the gate electrode 120 and the gate insulating film 130 may be interposed between the cut sheet patterns UP_R adjacent to each other in the third direction D3.

Figure 26:
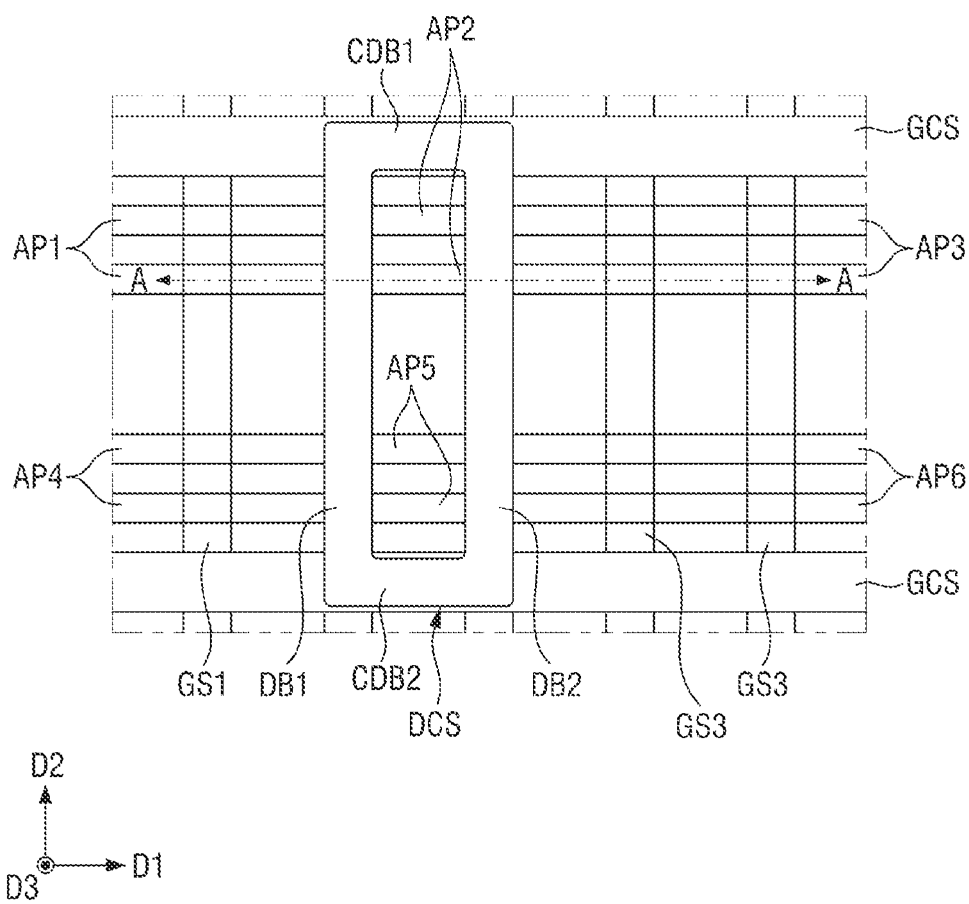
FIG. 26 is a layout view for explaining a semiconductor device according to an exemplary embodiment of the inventive concept.
Figure 27:
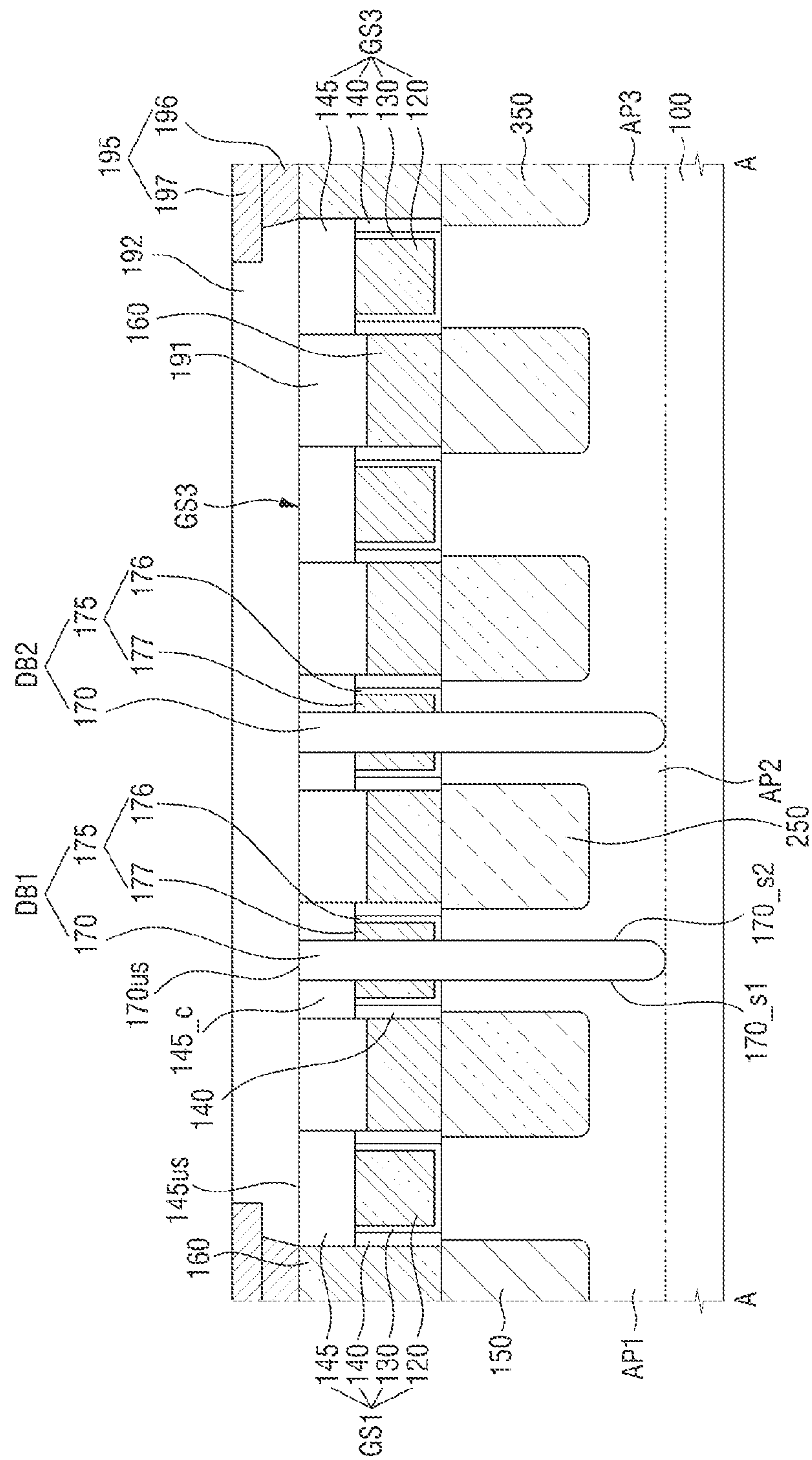
FIG. 27 is a cross-sectional view taken along a line A-A of FIG. 26 according to an exemplary embodiment of the inventive concept.

FIG. 26 is a layout view for explaining a semiconductor device according to exemplary embodiments of the inventive concept. FIG. 27 is a cross-sectional view taken along a line A-A of FIG. 26 according to exemplary embodiments of the inventive concept. For convenience of explanation, elements different from those explained with reference to FIGS. 1 to 9 will be mainly described.

Referring to FIGS. 26 and 27, in the semiconductor device according to exemplary embodiments of the inventive concept, the gate structure (e.g., the second gate structure GS2 of FIG. 1) is not placed between the first extended separation structure DB1 and the first extended separation structure DB2.

A gate electrode which intersects the second active pattern AP2 and the fifth active pattern AP5 is not placed on the second active pattern AP2 and the fifth active pattern AP5.

Only one second epitaxial pattern 250 may be placed on the second active pattern AP2 between the first extended separation structure DB1 and the first extended separation structure DB2. Similarly, only one epitaxial pattern may also be placed on the fifth active pattern AP5.

Figure 28:
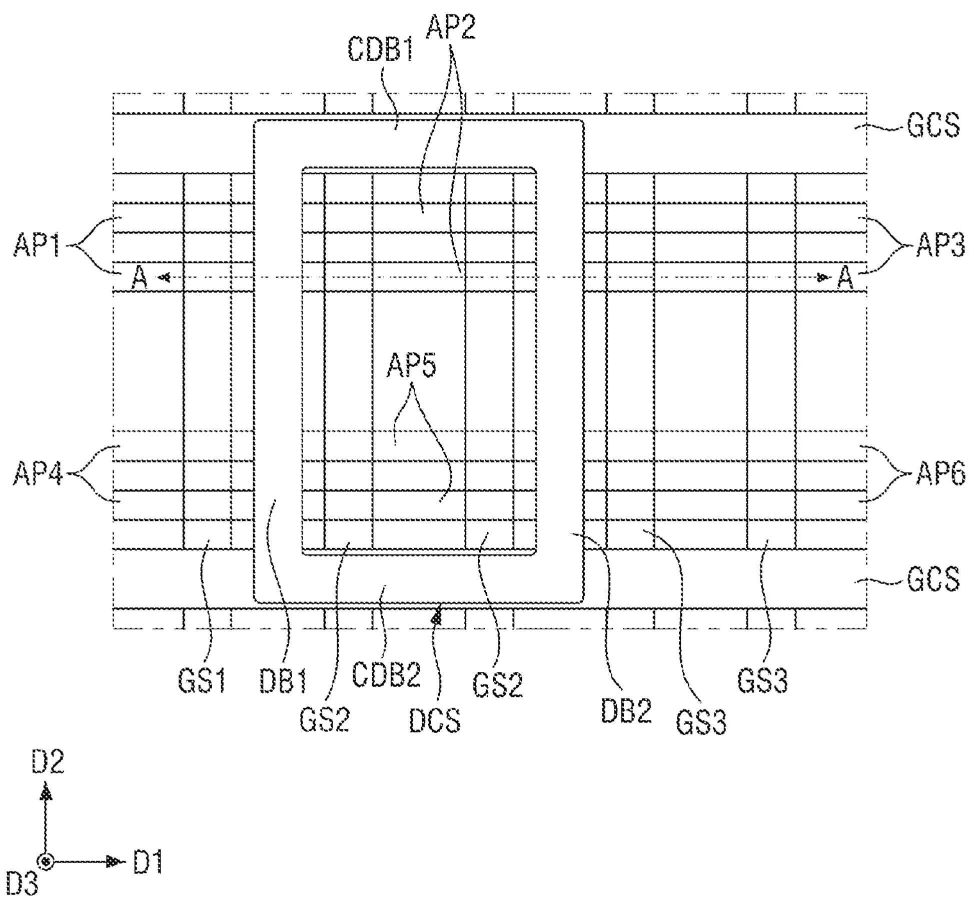
FIG. 28 is a layout view for explaining a semiconductor device according to an exemplary embodiment of the inventive concept.
Figure 29:
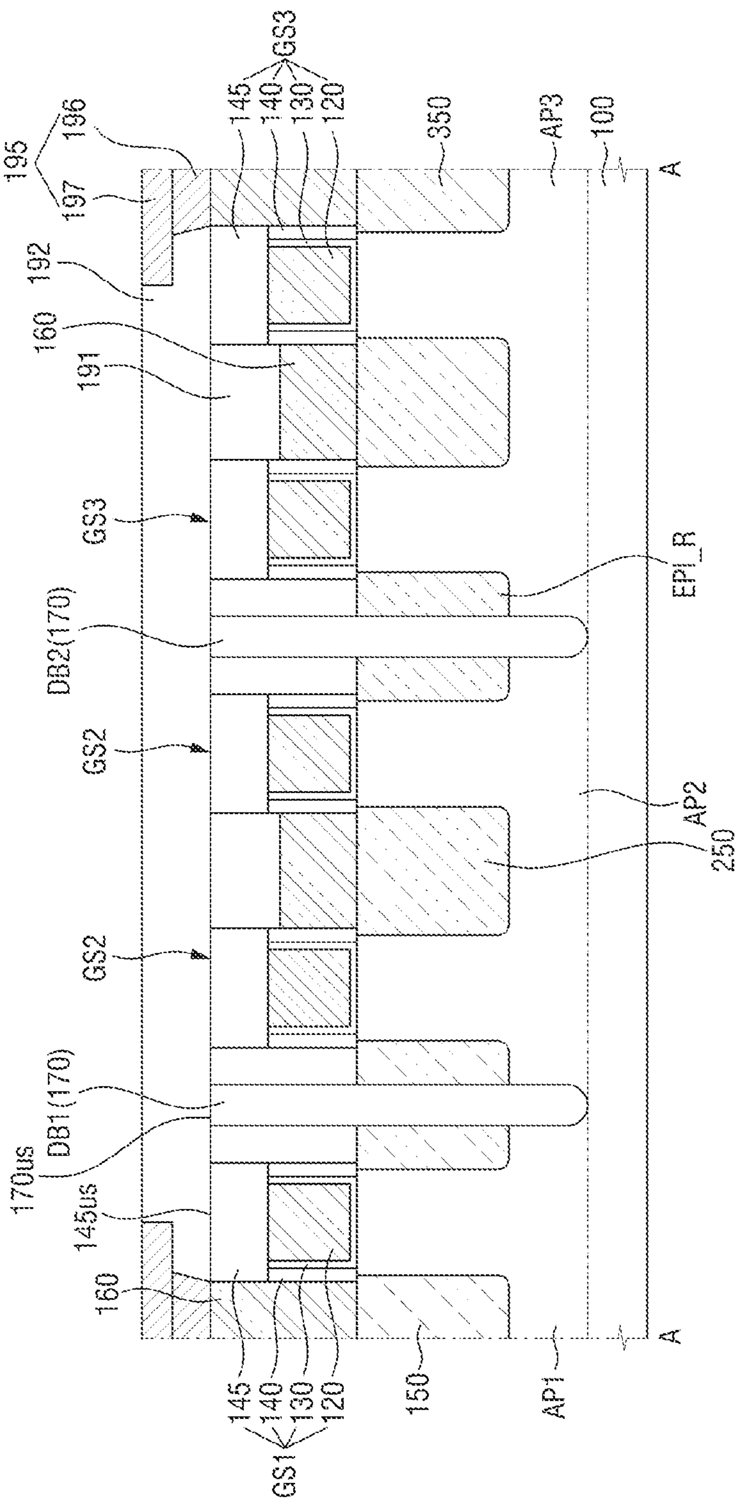
FIG. 29 is a cross-sectional view taken along a line A-A of FIG. 28 according to an exemplary embodiment of the inventive concept.

FIG. 28 is a layout view for explaining a semiconductor device according to exemplary embodiments of the inventive concept. FIG. 29 is a cross-sectional view taken along line A-A of FIG. 28 according to exemplary embodiments of the inventive concept. For convenience of explanation, elements different from those explained with reference to FIGS. 1 to 9 will be mainly described.

Referring to FIGS. 28 and 29, in the semiconductor device according to exemplary embodiments of the inventive concept, the first extended separation structure DB1 may be placed between the first gate structure GS1 and the second gate structure GS2, and the first extended separation structure DB2 may be placed between the second gate structure GS2 and the third gate structure GS3.

The first extended separation structure DB1 and the first extended separation structure DB2 may be placed by cutting an epitaxial pattern. Among the gate structure and the epitaxial pattern placed on the active pattern, the gate structure rather than the epitaxial pattern may be closest to the first extended separation structure DB1 and the first extended separation structure DB2.

A cut epitaxial pattern EPI_R which is left after etching may be placed on both sides of the first extended separation structure DB1 and the first extended separation structure DB2.

Since the first extended separation structure DB1 and the first extended separation structure DB2 are not formed at the position where a part of the gate structure is removed, each of the first extended separation structure DB1 and the first extended separation structure DB2 may include only the core separation pattern 170.

Figure 30:
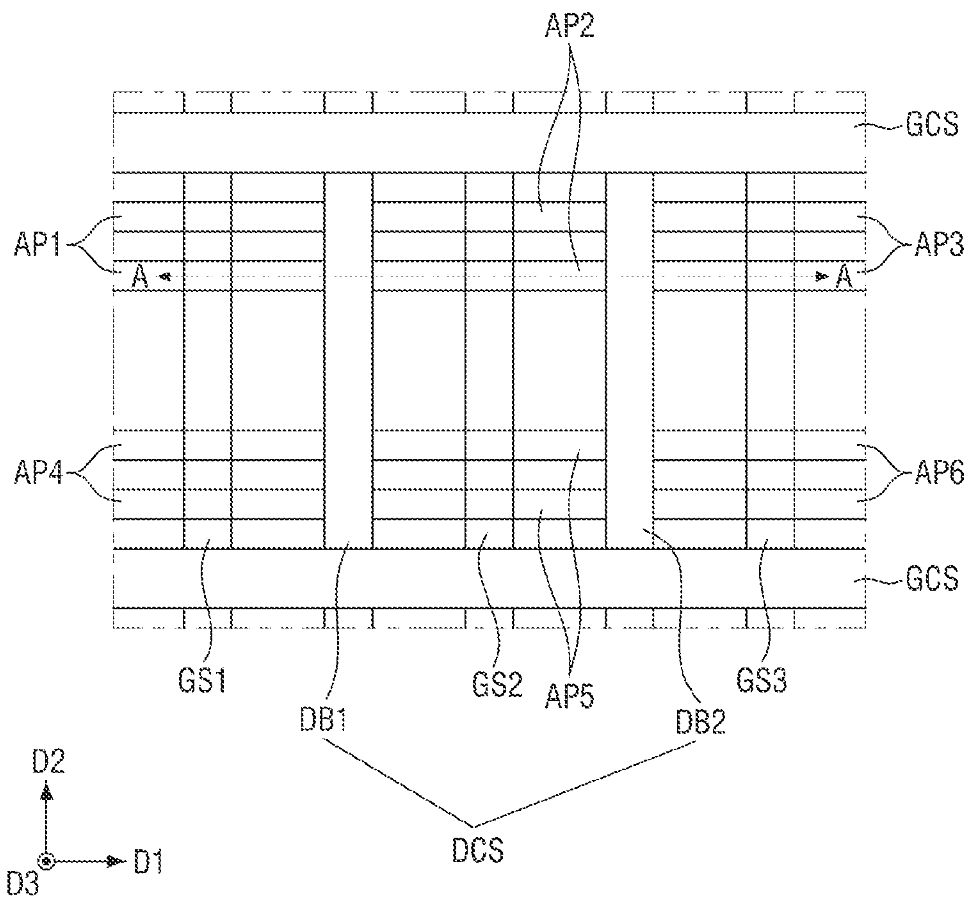
FIG. 30 is a layout view for explaining a semiconductor device according to an exemplary embodiment of the inventive concept.

FIG. 30 is a layout view for explaining a semiconductor device according to exemplary embodiments of the inventive concept. For convenience of explanation, elements different from those explained with reference to FIGS. 1 to 9 will be mainly described.

For reference, the cross-sectional view taken along a line A-A of FIG. 30 may be the same as that of FIG. 2.

Referring to FIG. 30, in the semiconductor device according to exemplary embodiments of the inventive concept, the element separation structure DCS does not include the second extended separation structure CDB1 and the second extended separation structure CDB2 extending in the first direction D1.

The element separation structure DCS includes the first extended separation structure DB1 and the first extended separation structure DB2 that extend in the second direction D2 and are spaced apart from each other in the first direction D1.

In other words, in this example, the element separation structure DCS does not have a closed-loop shape.

Figure 31:
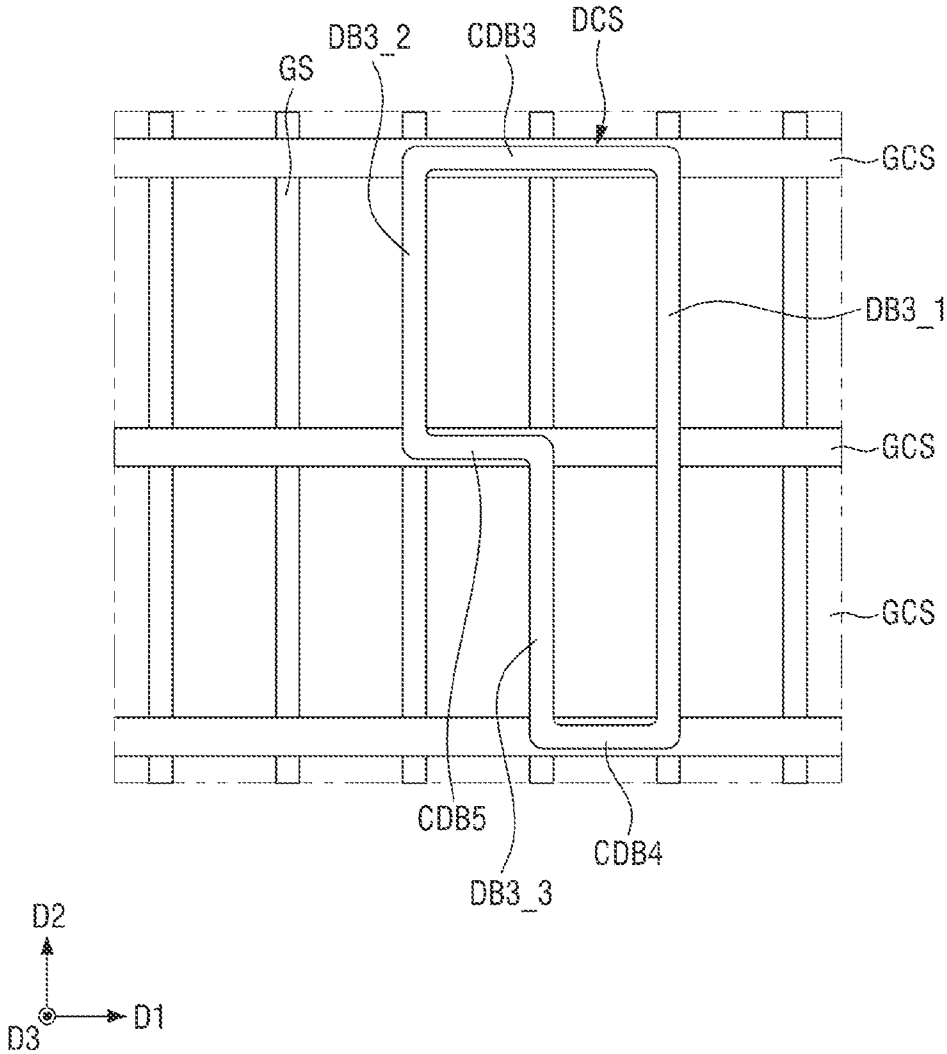
FIG. 31 is a layout view for explaining a semiconductor device according to an exemplary embodiment of the inventive concept.

FIG. 31 is a layout view for explaining a semiconductor device according to exemplary embodiments of the inventive concept. For reference, FIG. 31 only shows the gate separation structures GCS extending in the second direction D2, a gate pattern GS between the gate separation structures GCS, and the element separation structure DCS, and does not show the active patterns AP1 to AP6 as in FIG. 1.

Further, the gate pattern GS of FIG. 31 may correspond to the gate structures GS1 to GS3 of FIG. 1.

Referring to FIG. 31, in the semiconductor device according to exemplary embodiments of the inventive concept, the element separation structure DCS may include a third extended separation structure DB3_1, a third extended separation structure DB3_2, and a third extended separation structure DB3_3 extending in the second direction D2. The element separation structure DCS may also include a fourth extended separation structure CDB3, a fourth extended separation structure CDB4, and a fourth extended separation structure CDB5 extending in the first direction D1.

The third extended separation structure DB3_1, the third extended separation structure DB3_2, and the third extended separation structure DB3_3 may be connected to the fourth extended separation structure CDB3, the fourth extended separation structure CDB4, and the fourth extended separation structure CDB5.

The third extended separation structure DB3_1, the third extended separation structure DB3_2, and the third extended separation structure DB3_3 may be aligned with the gate pattern GS extending in the second direction D2.

The fourth extended separation structure CDB3, the fourth extended separation structure CDB4, and the fourth extended separation structure CDB5 may overlap the gate separation structure GCS in the third direction D3, on the gate separation structure GCS extending in the first direction D1.

The third extended separation structure DB3_1, the third extended separation structure DB3_2, and the third extended separation structure DB3_3 may correspond to one of the first extended separation structure DB1 and the first extended separation structure DB2 of FIG. 1.

The fourth extended separation structure CDB3, the fourth extended separation structure CDB4, and the fourth extended separation structure CDB5 may correspond to one of the second extended separation structure CDB1 and the second extended separation structure CDB2 of FIG. 1.

The element separation structure DCS may be placed between three or more gate separation structures GCS arranged in the second direction D2.

The closed-loop shape of the element separation structure DCS may be variously changed depending on the layout of the semiconductor device to be fabricated.

Figure 32:
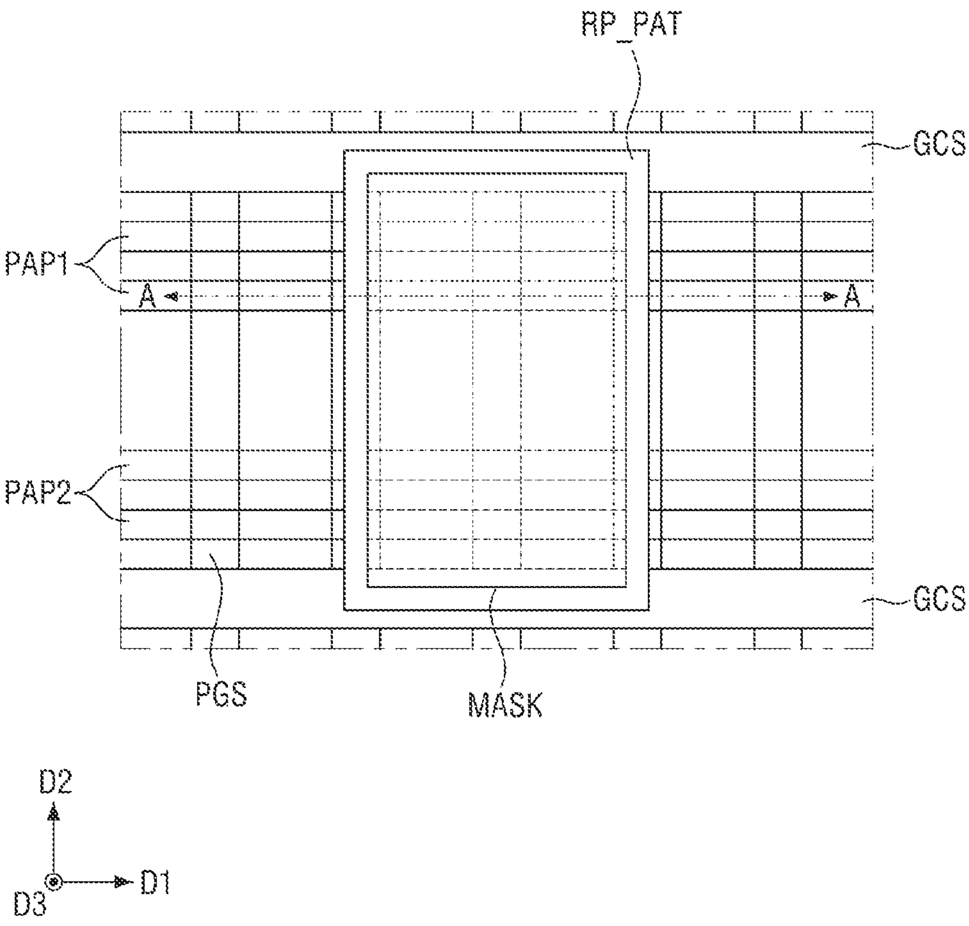
FIGS. 32 to 36 are intermediate stage diagrams for explaining a method for fabricating a semiconductor device according to an exemplary embodiment of the inventive concept.

FIGS. 32 to 36 are intermediate stage diagrams for explaining a method for fabricating a semiconductor device according to exemplary embodiments of the inventive concept. For reference, FIG. 32 is a layout view for explaining a method for fabricating a semiconductor device. FIGS. 33 to 36 are intermediate stage cross-sectional views taken along the line A-A of FIG. 32.

Figure 33:
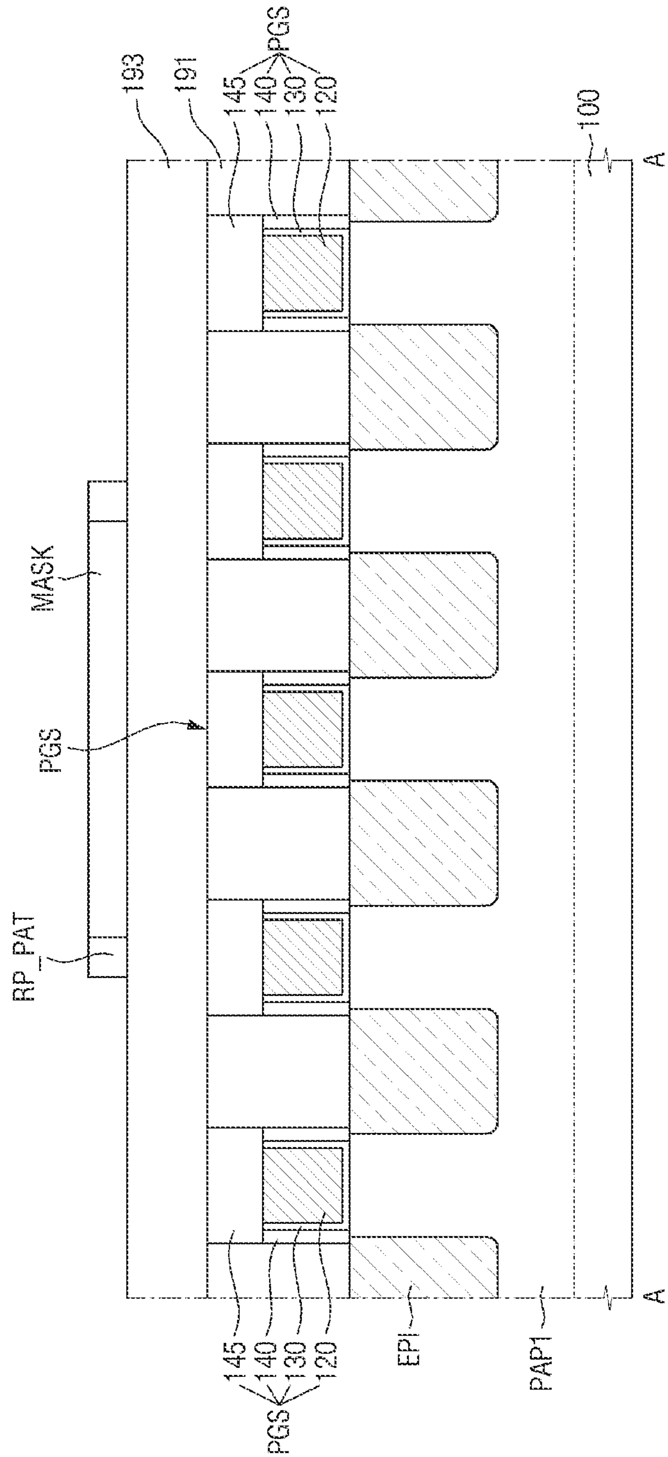

Referring to FIGS. 32 and 33, a first pre active pattern PAP1, a second pre active pattern PAP2, and a pre gate structure PGS may be placed between the gate separation structures GCS formed in the first direction D1.

The first pre active pattern PAP1 and the second pre active pattern PAP2 may extend in the first direction D1. The first pre active pattern PAP1 and the second pre active pattern PAP2 may be spaced apart from each other in the second direction D2.

The pre gate structure PGS may extend in the second direction D2. The pre gate structures PGS may be spaced apart from each other in the first direction D1. The pre gate structure PGS may include the gate electrode 120, the gate insulating film 130, the gate spacer 140, and the gate capping pattern 145.

A source/drain epi EPI may be placed between the pre gate structures PGS adjacent to each other in the first direction D1. The source/drain epi EPI may be placed on the first pre active pattern PAP1. According to an exemplary embodiment of the inventive concept, the source/drain epi EPI may be placed on the second pre active pattern PAP2.

The first interlayer insulating film 191 which covers the source/drain epi EPI is formed. The upper surface of the first interlayer insulating film 191 may be placed on the same plane as the upper surface of the gate capping pattern 145. The pre gate structure PGS may include a plurality of pre gate structures separated by the first interlayer insulating film 191.

A mold interlayer insulating film 193 may be formed on the first interlayer insulating film 191 and the pre gate structure PGS.

A mask pattern MASK having a polygonal shape may be formed on the mold interlayer insulating film 193. The mask pattern MASK may be formed on (e.g., overlap) a portion of the pre gate structure PGS. In other words, the mold interlayer insulating film 193 is disposed between the mask pattern MASK and the portion of the pre gate structure PGS.

Next, a replacement pattern RP_PAT may be formed along the side walls of the mask pattern MASK. The replacement pattern RP_PAT may have a closed-loop shape in which a portion extending in the first direction D1 and a portion extending in the second direction D2 are connected.

A portion of the replacement pattern RP_PAT extending in the first direction D1 may be placed at a position which overlaps the gate separation structure GCS in the third direction D3. A portion of the replacement pattern RP_PAT extending in the second direction D2 may be placed at a position which overlaps the pre gate structure PGS in the third direction D3.

Figure 34:
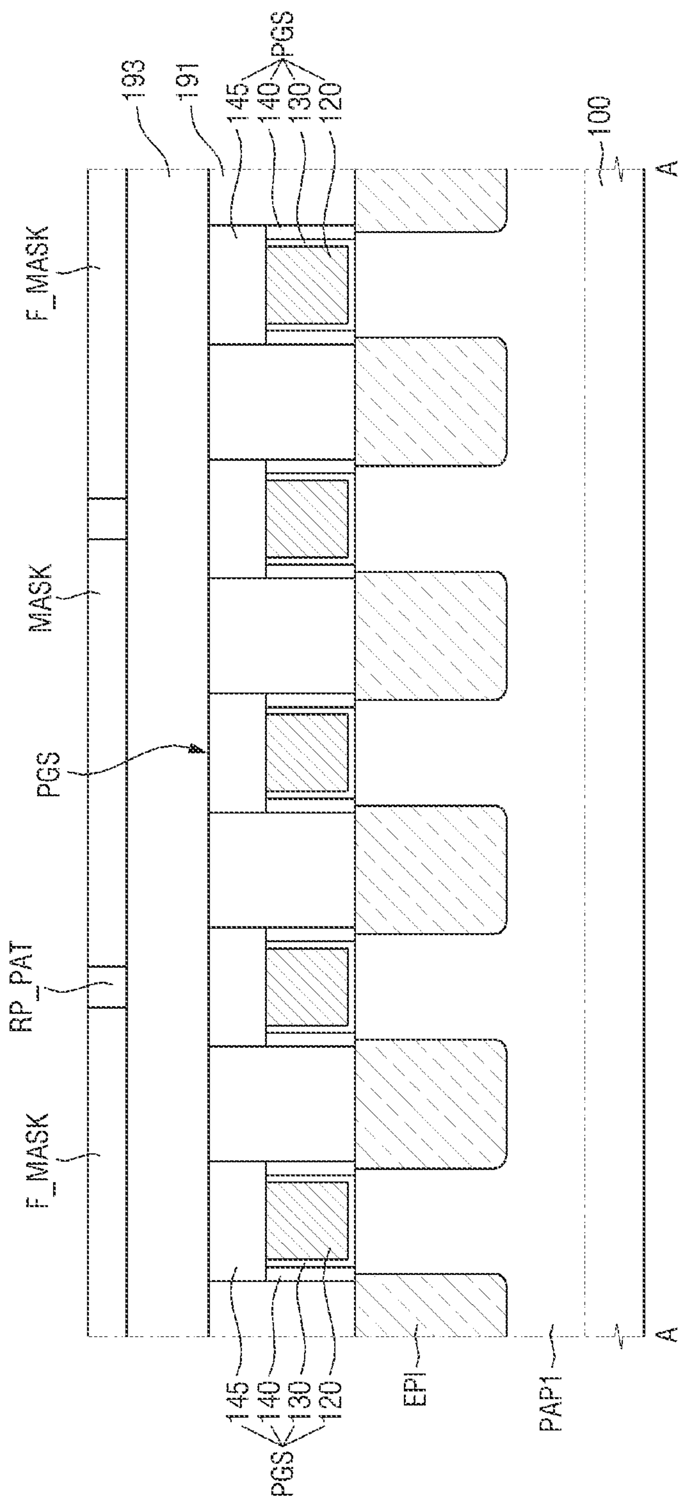

Referring to FIG. 34, a filling mask pattern F_MASK which surrounds the replacement pattern RP_PAT may be formed on the mold interlayer insulating film 193.

The filling mask pattern F_MASK covers the side walls of the replacement pattern RP_PAT, but does not cover the upper surface of the replacement pattern RP_PAT.

The filling mask pattern F_MASK and the mask pattern MASK may include a material having an etching selectivity to the replacement pattern RP_PAT.

Figure 35:
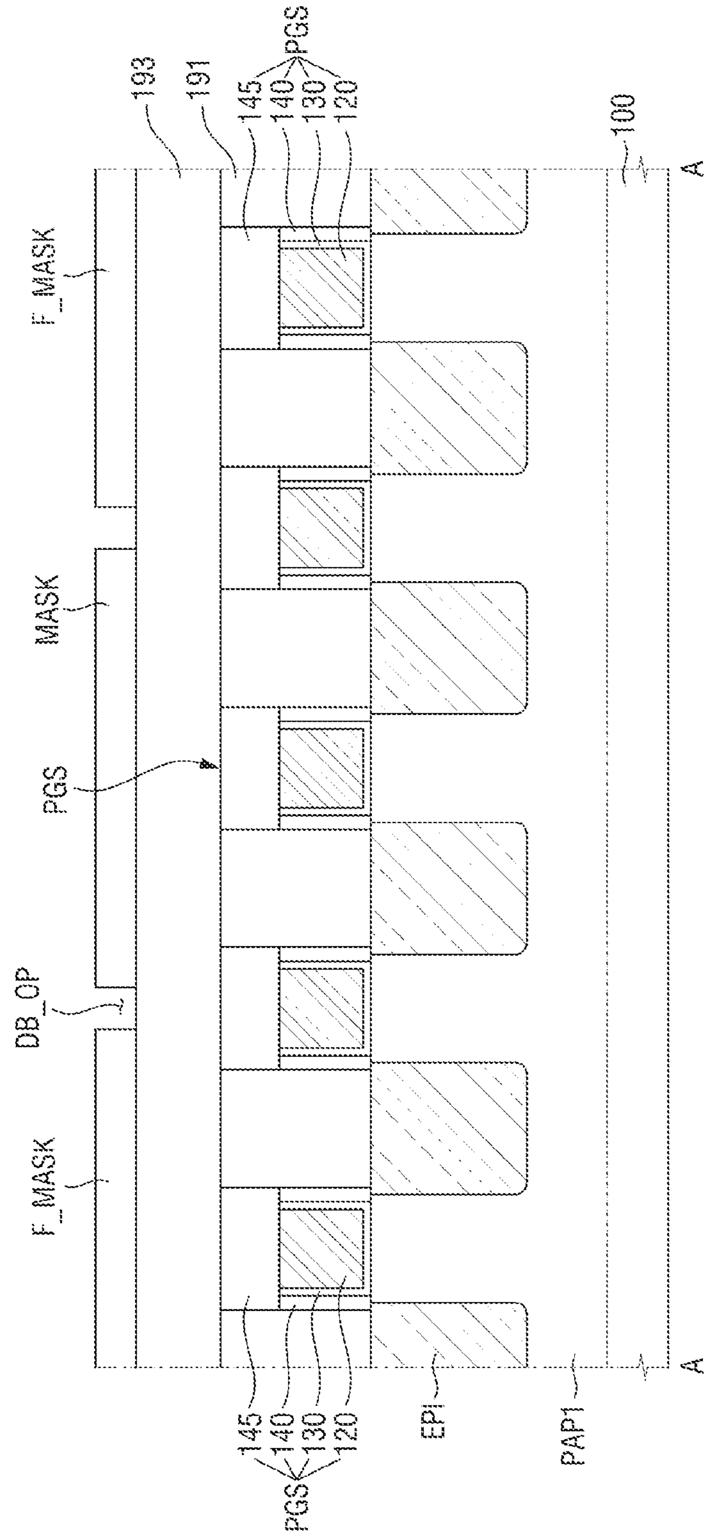

Referring to FIG. 35, by removing the replacement pattern RP_PAT, an element separation opening DB_OP may be formed between the filling mask pattern F_MASK and the mask pattern MASK.

The mold interlayer insulating film 193 may be exposed by the element separation opening DB_OP.

Figure 36:
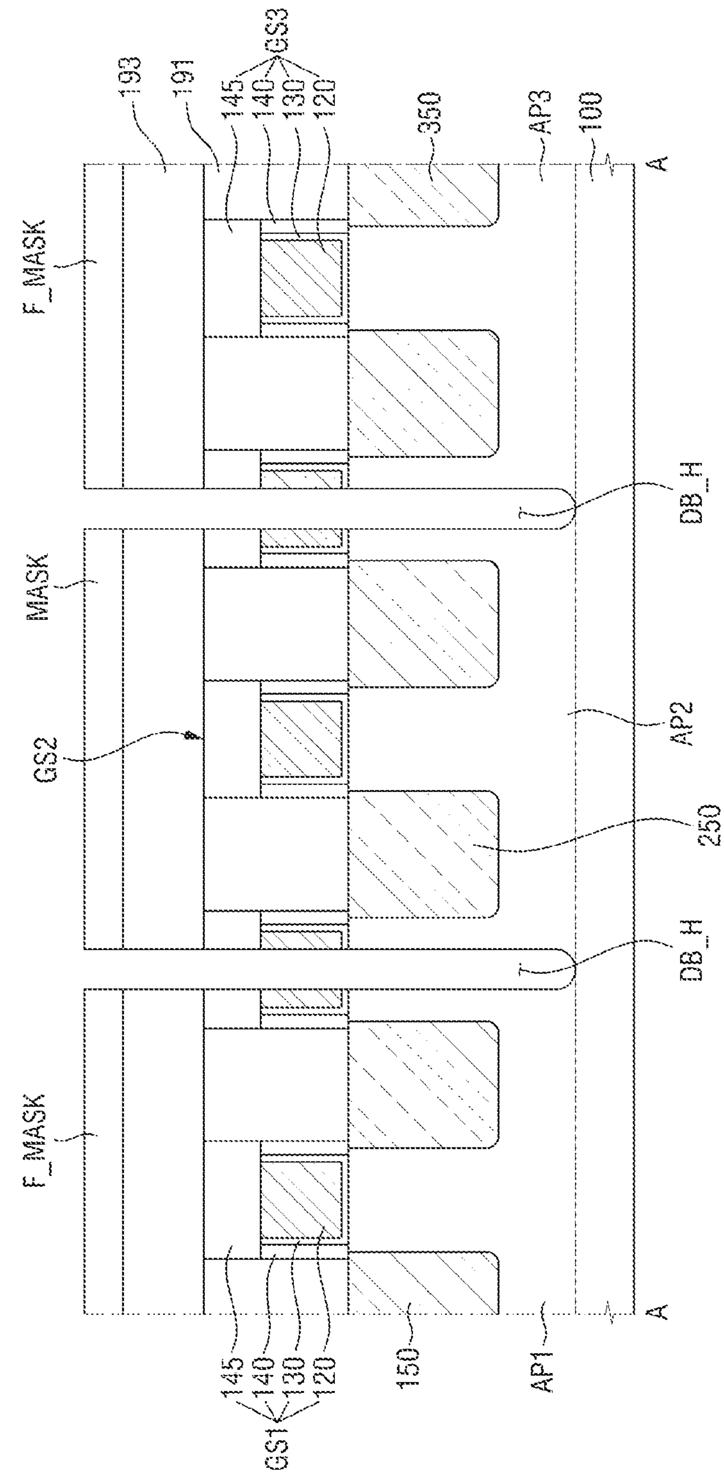

Referring to FIG. 36, the mold interlayer insulating film 193, the gate capping pattern 145, the gate electrode 120, the gate insulating film 130, and the first pre active pattern PAP1 of the portion that overlaps the element separation opening DB_OP may be removed, by utilizing the filling mask pattern F_MASK and the mask pattern MASK as etching masks.

An element separation trench DB_H extending in the second direction (D2 of FIG. 32) may be formed accordingly.

According to an exemplary embodiment of the inventive concept, the element separation trench DB_H may also be formed in the gate separation structure (GCS of FIG. 32).

For example, the mold interlayer insulating film 193, the gate capping pattern 145, and the gate separation structure GCS may be removed until the gate electrode 120 is exposed, by utilizing the filling mask pattern F_MASK and the mask pattern MASK as etching masks.

After the gate electrode 120 is exposed, the gate electrode 120 and the gate insulating film 130 may be sequentially etched so that the first pre active pattern PAP1 is exposed. The gate separation structure GCS may not be etched while the gate electrode 120 and gate insulating film 130 are being etched.

Next, by removing the exposed first pre active pattern PAP1, the first to third active patterns AP1 to AP3 adjacent to each other in the first direction D1 may be formed.

Next, the filling mask pattern F_MASK and the mask pattern MASK may be removed. Additionally, the core separation pattern (170 of FIG. 2) that fills the element separation trench DB_H may be formed.

By separating the active patterns using the method as mentioned above, it is possible to stably separate the active patterns in a down-scaled semiconductor device. For example, the position at which the element separation trench DB_H is formed corresponds to the position at which the replacement pattern RP_PAT is formed. When the width of the replacement pattern RP_PAT in the first direction D1 changes, the width of the element separation trench DB_H in the first direction D1 corresponding thereto also changes. Therefore, even if the gate pitch or the like are reduced, the active patterns may be stably separated through the aforementioned method.

Alternatively, unlike the aforementioned case, before forming the element separation opening DB_OP, the replacement pattern RP_PAT (the portion extending in the first direction D1 of FIG. 32) that overlaps the gate separation structure GCS in the third direction D3 may be removed.

Next, the mask material may be filled at a position where the portion of the replacement pattern RP_PAT extending in the first direction D1 is removed. When the element separation opening DB_OP is formed after such a process, the element separation structure DCS, as shown in FIG. 30, may be formed.

While the inventive concept has been shown and described with reference to exemplary embodiments thereof, it will be apparent to those of ordinary skill in the art that various modifications in form and details may be made thereto without departing from the spirit and scope of the inventive concept as set forth by the appended claims.

What is claimed is:

1. A semiconductor device comprising:

a first lower pattern and a second lower pattern each extending in a first direction;

a plurality of first sheet patterns on the first lower pattern;

a plurality of the second sheet patterns on the second lower pattern;

a first epitaxial pattern which is placed on the first lower pattern and disposed adjacent to the second lower pattern;

a second epitaxial pattern which is placed on the second lower pattern and disposed adjacent to the first lower pattern;

an element separation structure which separates the first lower pattern and the second lower pattern between the first epitaxial pattern and the second epitaxial pattern, wherein the element separation structure includes a core separation pattern, and a separation side wall pattern on a side wall of the core separation pattern; and a gate structure extending in a second direction intersecting the first direction, and disposed on the first lower pattern, wherein an upper surface of the gate structure is placed on the same plane as an upper surface of the core separation pattern, the separation side wall pattern includes a high dielectric constant liner, and the high dielectric constant liner includes a high dielectric constant dielectric film including a metal.

2. The semiconductor device of claim 1, wherein the gate structure includes a gate electrode, and a gate insulating film extending along a side wall and a bottom surface of the gate electrode, and the high dielectric constant liner includes a material included in the gate insulating film.

3. The semiconductor device of claim 1, wherein the core separation pattern comprises a first side wall and a second side wall opposite each other, wherein the separation side wall pattern is placed on the first side wall, and wherein the separation side wall pattern is not placed on the second side wall.

4. The semiconductor device of claim 1, wherein the core separation pattern includes an air gap.

5. The semiconductor device of claim 1, wherein the core separation pattern comprises a first side wall and a second side wall opposite each other, wherein the high dielectric constant liner includes a first portion on the first side wall and a second portion on the second side wall, wherein the first portion of the high dielectric constant liner has an L shape, and wherein the second portion of the high dielectric constant liner has an I shape.

6. The semiconductor device of claim 1, wherein the core separation pattern includes a lower part, a width expansion part on the lower part, and an upper part on the width expansion part, wherein the width expansion part of the core separation pattern is contact with the high dielectric constant liner.

7. The semiconductor device of claim 1, wherein the separation side wall pattern further includes a conductive separation liner placed between the core separation pattern and the high dielectric constant liner, the gate structure includes a gate electrode, and the conductive separation liner includes a material included in the gate electrode.

8. The semiconductor device of claim 1, wherein an upper surface of the separation side wall pattern is lower than an upper surface of the core separation pattern.

9. The semiconductor device of claim 1, wherein the core separation pattern includes a core separation liner, and a core filling pattern which is placed on the core separation liner and fills a filling separation trench defined by the core separation liner.

10. The semiconductor device of claim 1, wherein the high dielectric constant liner has an L shape.

11. The semiconductor device of claim 10, wherein the high dielectric constant liner includes a bottom part extending in the first direction, and a vertical extension part extending in a third direction intersecting the first direction and the second direction, the bottom part of the high dielectric constant liner has a first end and a second end, the vertical extension part of the high dielectric constant liner extends from the first end of the bottom part of the high dielectric constant liner in the third direction, and the second end of the bottom part of the high dielectric constant liner faces the side wall of the core separation pattern.

12. A semiconductor device comprising:

an element separation structure which includes a first extended separation structure and a second extended separation structure extending in a first direction, and a third extended separation structure and a fourth extended separation structure extending in a second direction different from the first direction, wherein the element separation structure has a closed-loop shape;

a first active pattern and a second active pattern which are separated by the first extended separation structure and each extend in the second direction;

a first gate structure extending in the first direction, including a gate electrode, and disposed on the first active pattern; and a gate separation structure which is formed along the second direction and the faces a first side of the gate electrode, wherein the third extended separation structure is placed on a part of the gate separation structure, and wherein the first to fourth extended separation structure each include a core separation liner, and a core filling pattern which is placed on the core separation liner and fills a filling separation trench defined by the core separation liner.

13. The semiconductor device of claim 12, wherein the first extended separation structure and the second extended separation structure each include a core separation pattern, and a separation side wall pattern on a side wall of the core separation pattern, the separation side wall pattern includes a high dielectric constant liner, and the high dielectric constant liner includes a high dielectric constant dielectric film including a metal.

14. The semiconductor device of claim 13, wherein the gate structure includes a gate electrode, and a gate insulating film extending along a side wall and a bottom surface of the gate electrode, and the high dielectric constant liner includes a material included in the gate insulating film.

15. The semiconductor device of claim 13, wherein the core separation pattern comprises a first side wall and a second side wall opposite each other, wherein the separation side wall pattern is placed on the first side wall, and wherein the separation side wall pattern is not placed on the second side wall.

16. The semiconductor device of claim 13, wherein the core separation pattern comprises a first side wall and a second side wall opposite each other, wherein the high dielectric constant liner includes a first portion on the first side wall and a second portion on the second side wall, wherein the first portion of the high dielectric constant liner has an L shape, and wherein the second portion of the high dielectric constant liner has an I shape.

17. The semiconductor device of claim 12, wherein each of the first active pattern and the second active pattern includes a plurality of sheet patterns.

18. A semiconductor device comprising:

a first lower pattern and a second lower pattern each extending in a first direction;

a plurality of first sheet patterns on the first lower pattern;

a plurality of the second sheet patterns on the second lower pattern;

a first epitaxial pattern on the first lower pattern;

a second epitaxial pattern on the second lower pattern;

a first element separation structure which separates the first lower pattern and the second lower pattern, between the first epitaxial pattern and the second epitaxial pattern;

a gate structure extending in a second direction intersecting the first direction, on the first lower pattern, and surrounding the plurality of the first sheet pattern;

a gate separation structure which is in contact with the first element separation structure; and a second element separation structure which is placed on the gate separation structure and directly connected to the first element separation structure, wherein an upper surface of the second element separation structure is placed on the same plane as an upper surface of the gate structure and an upper surface of the first element separation structure.

19. The semiconductor device of claim 18, wherein the first element separation structure includes a core separation pattern, and a separation side wall pattern on a side wall of the core separation pattern, the separation side wall pattern includes a high dielectric constant liner, and the high dielectric constant liner includes a high dielectric constant dielectric film including a metal.

20. The semiconductor device of claim 19, wherein the gate structure includes a gate electrode, and a gate insulating film extending along a side wall and a bottom surface of the gate electrode, and the high dielectric constant liner includes a material included in the gate insulating film.

* * * * *